US012660561B2

(12) United States Patent (10) Patent No.: US 12,660,561 B2

Ogawa et al. (45) Date of Patent: Jun. 16, 2026

(54) LOAD PORT

(71) Applicant: Sinfonia Technology Co., Ltd., Tokyo (JP)

(72) Inventors: Tatsuru Ogawa, Tokyo (JP); Yuki Ishihara, Tokyo (JP); Shinpei Kogiso, Tokyo (JP); Atsushi Suzuki, Tokyo (JP); Yuki Matsumoto, Tokyo (JP); Tatsuya Miura, Tokyo (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 425 days.

(21) Appl. No.: 18/383,938

(22) Filed: Oct. 26, 2023

(65) Prior Publication Data

US 2024/0145285 A1 May 2, 2024

(30) Foreign Application Priority Data

Oct. 26, 2022 (JP) ................................. 2022-171605
Jun. 15, 2023 (JP) ................................. 2023-098531

(51) Int. Cl.
*H10P 72/30* (2026.01)
(52) U.S. Cl.
CPC ...... *H10P 72/3202* (2026.01); *H10P 72/3406* (2026.01)
(58) Field of Classification Search
CPC ............. H10P 72/3202; H10P 72/3406; H10P 72/3408; H01L 21/677706; H01L 21/677772; H01L 21/677775; E05B 65/0021; E05D 15/22; E05D 15/165; E05D 15/565
See application file for complete search history.

(56) References Cited

U.S. PATENT DOCUMENTS

| | | | | |
|---|---|---|---|---|
| 6,896,470 B1 * | 5/2005 | Chen | .................. | H10P 72/3408 |
| | | | | 414/217 |
| 7,021,882 B2 * | 4/2006 | Otaguro | .............. | H10P 72/3406 |
| | | | | 414/217.1 |
| 2002/0064439 A1 * | 5/2002 | Otaguro | .............. | H10P 72/0608 |
| | | | | 414/217.1 |
| 2002/0069933 A1 * | 6/2002 | Otaguro | .............. | H10P 72/3406 |
| | | | | 141/98 |
| 2014/0338288 A1 * | 11/2014 | Funato | ................ | H10P 72/0608 |
| | | | | 53/382.1 |

FOREIGN PATENT DOCUMENTS

| | | | |
|---|---|---|---|
| JP | 2013087814 A | * | 5/2013 |
| JP | 2014-225547 A | | 12/2014 |

* cited by examiner

*Primary Examiner* — Saul Rodriguez
*Assistant Examiner* — Jaimin G Patel
(74) *Attorney, Agent, or Firm* — Kilpatrick Townsend & Stockton LLP

(57) ABSTRACT

A load port includes: a plate-shaped base member having an opening via which a transfer target object is loaded and unloaded; a door member capable of opening and closing the opening; a link mechanism including a link member having one end rotatably connected to the door member; a guide roller configured to move together with the door member; a guide surface bent to extend from a first direction to a second direction and configured to guide the guide roller; a drive member to which the other end of the link member is rotatably connected; and a driver configured to move the drive member in the second direction.

9 Claims, 29 Drawing Sheets

LOAD PORT

CROSS-REFERENCE TO RELATED APPLICATIONS

This application is based upon and claims the benefit of priority from Japanese Patent Application No. 2022-171605, filed on Oct. 26, 2022, and Japanese Patent Application No. 2023-098531, filed on Jun. 15, 2023, the entire contents of which are incorporated herein by reference.

TECHNICAL FIELD

The present disclosure relates to a load port disposed adjacent to, for example, a semiconductor processing apparatus.

BACKGROUND

In the related art, semiconductor manufacturing has been accomplished by performing various processing processes on a transfer target object such as a wafer or the like. In recent years, elements have become more highly integrated and circuits have become more miniaturized. Therefore, it is required to maintain a highly clean environment around the transfer target object to prevent particles from adhering to a surface of the transfer target object.

In a load port that transfers a transfer target object between a processing apparatus that processes the transfer target object and a FOUP (Front-Opening Unified Pod), in a case where a drive mechanism configured to open and close a door and a drive mechanism configured to raise and lower the door are provided separately, particles may be generated at connection points that connect respective guide rails.

Therefore, in the load port disclosed in Patent Document 1, a guide roller installed at a link mechanism is configured to move from a horizontal direction to a vertical direction or from the vertical direction to the horizontal along a guide groove in conjunction with a vertical reciprocating movement of a drive member, thereby suppressing generation of particles at a connection point of two shafts.

PRIOR ART DOCUMENT

Patent Document

Patent Document 1: Japanese Patent Application Publication No. 2014-225547

However, in the load port of Patent Document 1, an appropriate clearance is required in the link mechanism to smoothly move the guide roller installed at the link mechanism along the guide groove. Due to such a requirement, as shown in FIG. 21A, when a guide roller 561 passes through a guide connection portion 552N that connects a guide surface 552a extending along a horizontal direction (Y direction) and a guide surface 552b extending along a vertical direction (Z direction), a gap may be formed between the guide roller 561 and the guide connection portion 552N. In such a case, when a direction of movement of the guide roller 561 is changed from the horizontal direction to the vertical direction, the guide roller 561 falls by gravity to fill the above-mentioned gap. Therefore, as shown in FIG. 21B, the guide roller 561 and the guide connection portion 552N come into contact with each other, causing a door to vibrate when opening and closing the door. In a case where such vibration occurs, noise may be generated, a FOUP door may fall, wear of the guide roller 561 may be accelerated, the guide roller 561 may be cracked, the guide roller 561 may resonate with other parts, or particles may be generated. In such a case, if a door opening/closing speed is lowered to prevent such problems from occurring, a door opening/closing operation time becomes longer.

SUMMARY

The present disclosure provides a load port capable of suppressing vibration of a door when opening and closing the door.

The present disclosure considers the following configuration to achieve the above-mentioned feature.

According to an embodiment of the present disclosure, there is provided a load port including: a plate-shaped base member having an opening via which a transfer target object is loaded and unloaded; a door member capable of opening and closing the opening; a link mechanism including a link member having one end rotatably connected to the door member; a guide roller configured to move together with the door member; a guide surface bent to extend from a first direction to a second direction and configured to guide the guide roller; a drive member to which the other end of the link member is rotatably connected; and a driver configured to move the drive member in the second direction, wherein the link mechanism is configured to allow the guide roller to move along the guide surface from the first direction to the second direction or from the second direction to the first direction while the other end of the link member is moving in the second direction, and a presser is provided to press the guide roller toward a guide connection portion when the guide roller passes through the guide connection portion that connects a first guide surface extending along the first direction and a second guide surface extending along the second direction.

According to this configuration, when the guide roller passes through the guide connection portion that connects the guide surface extending along the first direction and the guide surface extending along the second direction, the guide roller is pressed toward the guide connection portion. Therefore, the guide roller passes through the guide connection portion while being in contact with the guide connection portion. As a result, a gap is not formed between the guide roller and the guide connection portion, which makes it possible to suppress vibration of the door when opening and closing the door. Accordingly, it is possible to prevent generation of noise, falling of the FOUP door, acceleration of wear of the guide roller, generation of cracks in the guide roller, resonance of the guide roller with other parts, or generation of particles, which may be caused by the vibration of the door. Therefore, a door opening/closing speed may be improved, and a door opening/closing operation time may be shortened.

In the load port of the present disclosure, the presser includes an elastic member disposed along the first direction.

According to this configuration, the presser may be easily disposed relative to the load port.

In the load port of the present disclosure, the elastic member is movable together with the door member, and an elastic member bearing member is disposed at a position where the elastic member bearing member comes into contact with the elastic member when the guide roller moves so as to be close to the guide connection portion and a distance between the guide roller and the guide connection portion becomes a predetermined distance.

According to this configuration, the elastic member is installed at the door member on the moving side, making it easier to replace the elastic member as compared to a case where the elastic member is installed at the member on the non-moving side.

In the load port of the present disclosure, a pressing force of the presser is smaller than a driving force that moves the door member in the first direction when the drive member moves in the second direction.

According to this configuration, even when the presser is disposed, there is almost no need to increase the driving force that moves the door member in the first direction.

In the load port of the present disclosure, two guide surfaces are arranged on both sides of the drive member, and the presser is arranged on each of the two guide surfaces.

According to this configuration, one end of the link member is pressed equally against the two guide surfaces, which makes it possible to prevent the door from being tilted.

BRIEF DESCRIPTION OF DRAWINGS

The accompanying drawings, which are incorporated in and constitute a part of the specification, illustrate embodiments of the present disclosure.

FIG. 7 is a side view illustrating a configuration of the door member.

FIGS. 12A, 12B, and 12C are schematic diagrams illustrating an operation of a guide roller moving along a guide connection portion.

Figures 21A, 21B:
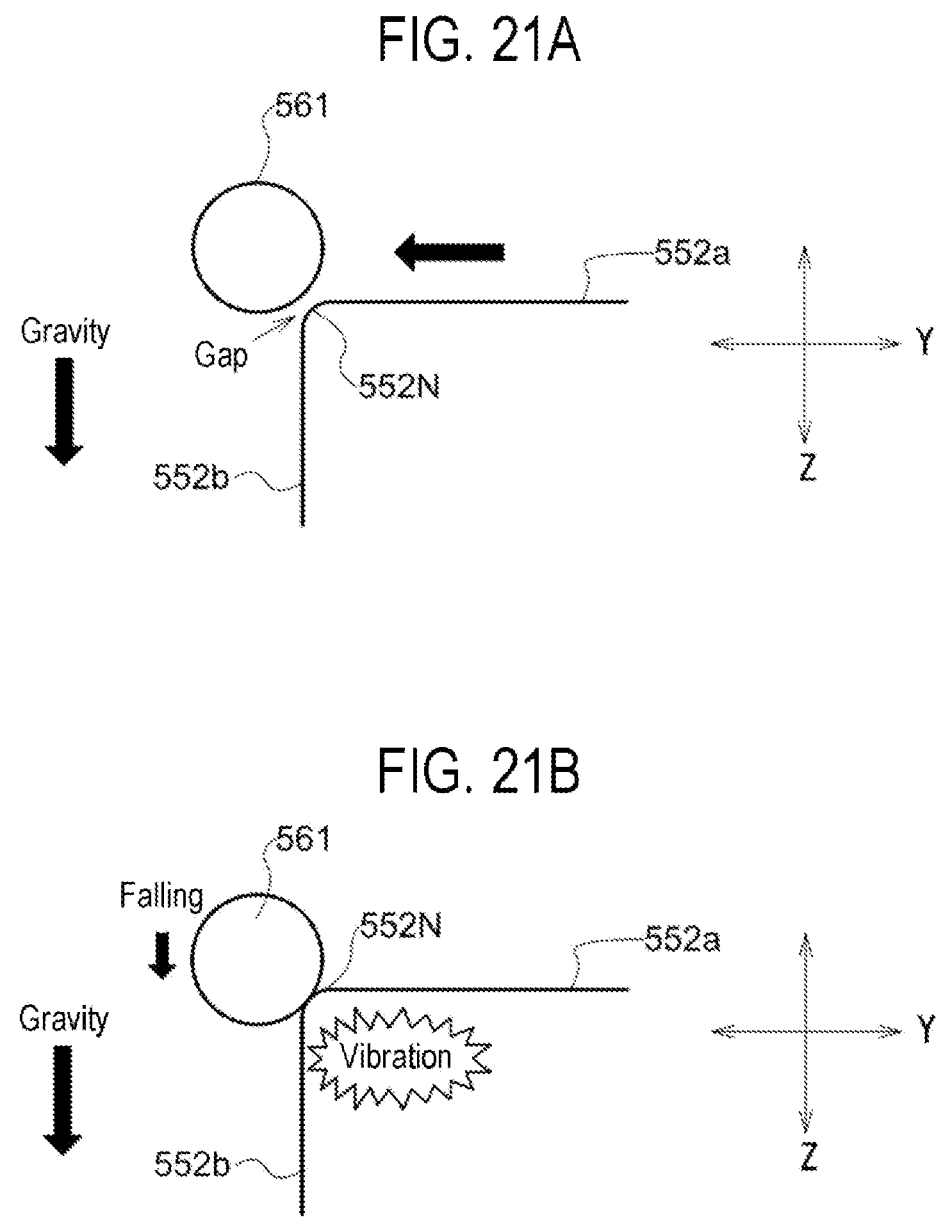

FIGS. 21A and 21B are diagram illustrating a technical challenge of a load port in the related art.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
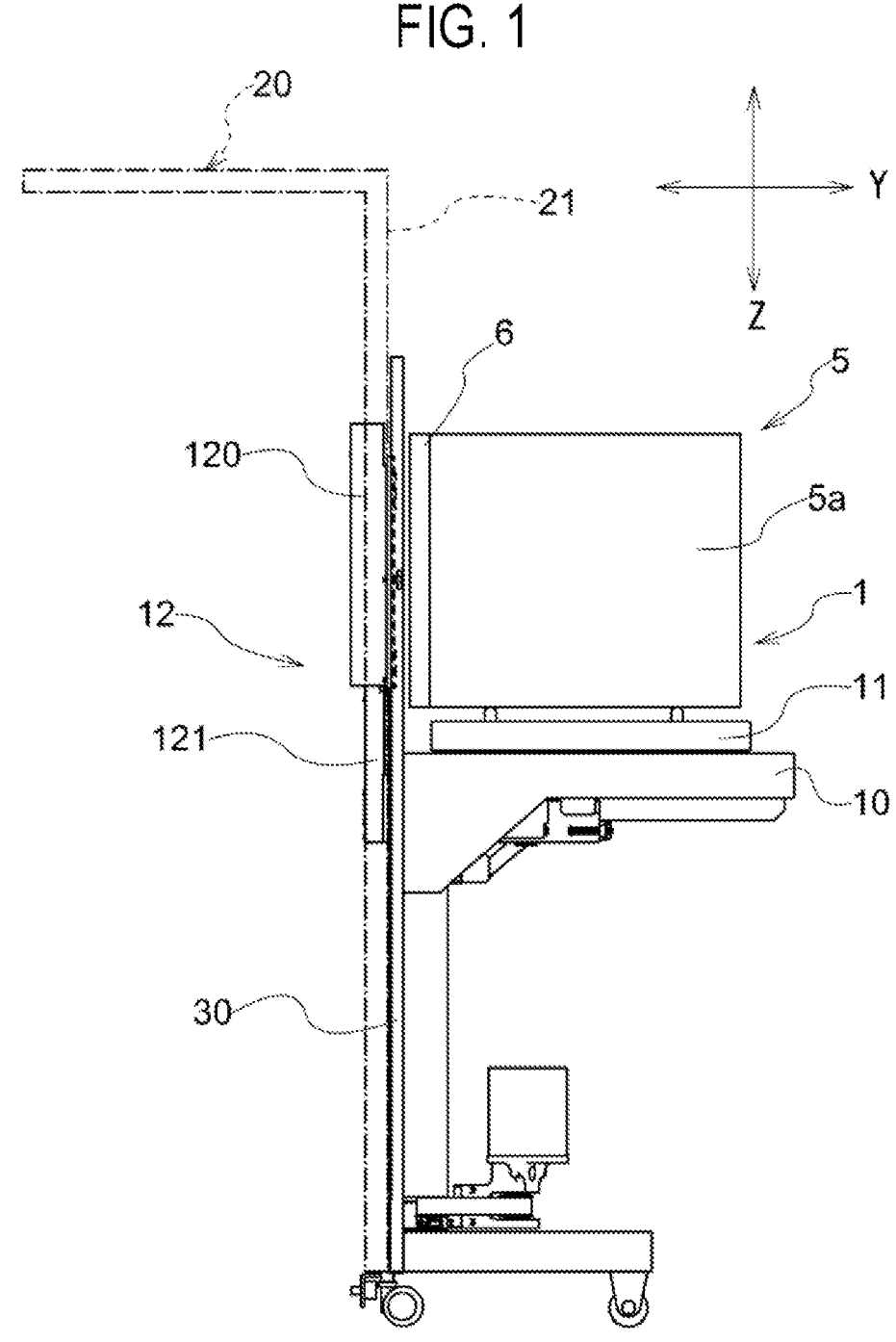
FIG. 1 is a side view of a load port according to a first embodiment of the present disclosure.
Figure 2:
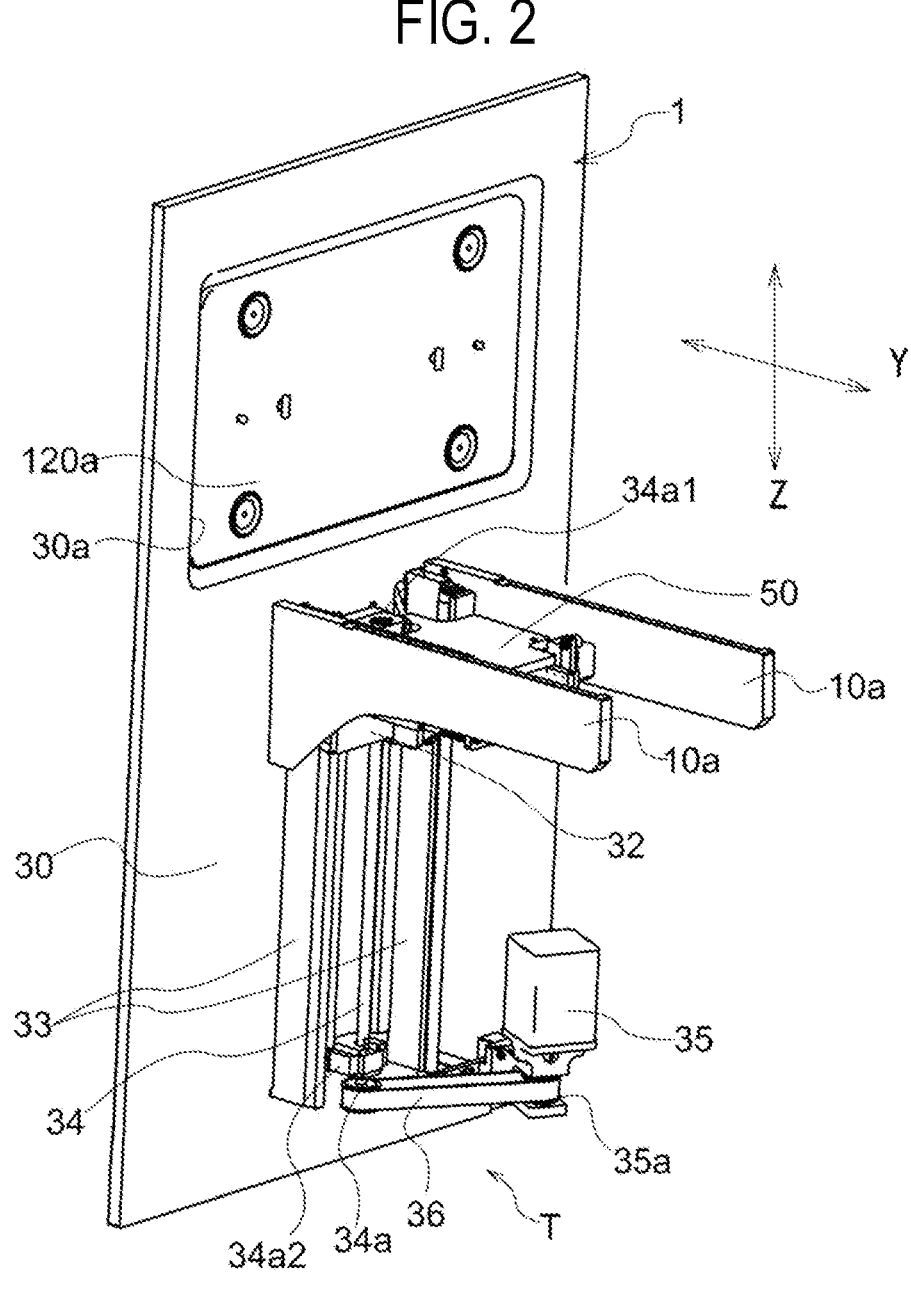
FIG. 2 is a perspective view showing a mounting table and a FOUP support mechanism of the load port in a separated state.
Figure 3:
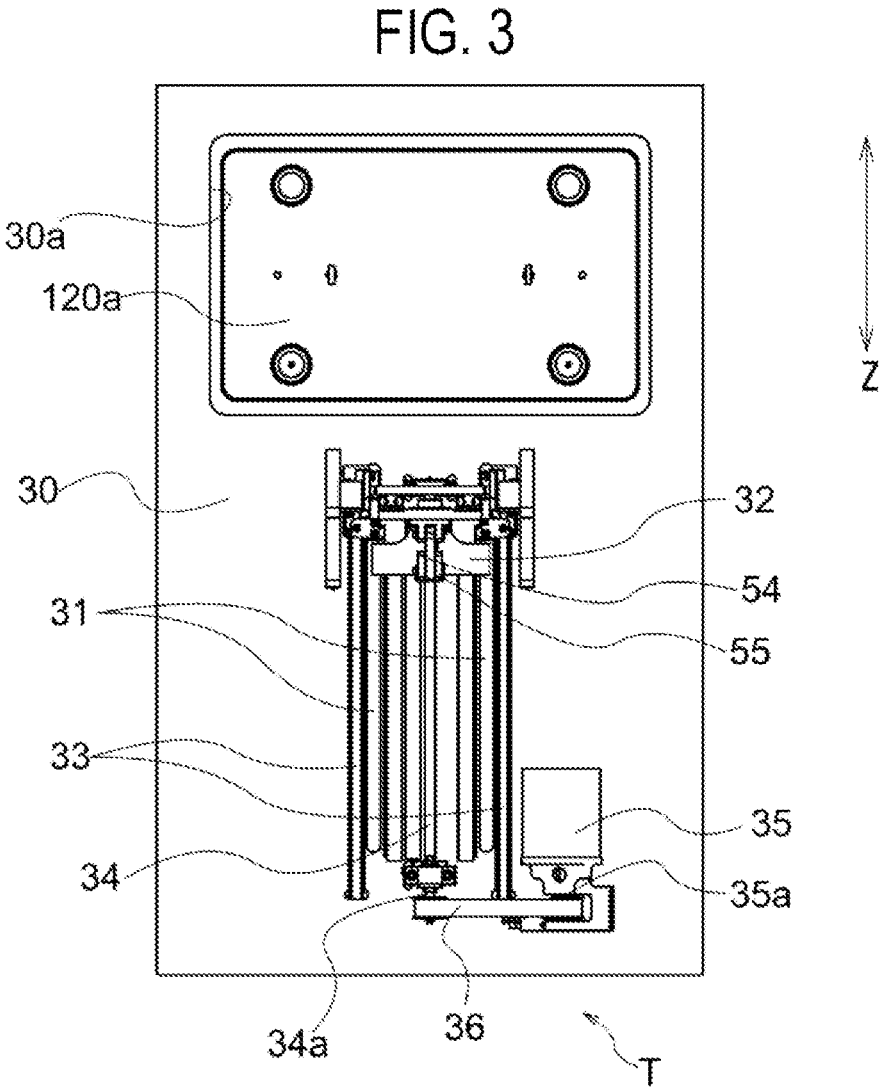
FIG. 3 is a front view showing the mounting table and the FOUP support mechanism of the load port in a separated state.

Hereinafter, a first embodiment of the present disclosure will be described with reference to the drawings. FIG. 1 is a side view of a load port 1 according to a first embodiment of the present disclosure. FIG. 2 is a perspective view showing a mounting table 10 and a FOUP support mechanism 11 of the load port 1 in a separated state. FIG. 3 is a front view showing the mounting table 10 and the FOUP support mechanism 11 of the load port 1 in a separated state.

As shown in FIGS. 1 to 3, the load port 1 of the present embodiment is used by being fixed to an installation surface 21 of a semiconductor processing apparatus 20. The load port 1 allows a door member 12 to hold a FOUP door 6 of a FOUP 5 supported on a mounting table 10, and opens and closes the FOUP door 6 by moving the door member 12 in a direction orthogonal to the installation surface 21 (horizontal direction) and in a direction parallel to the installation surface 21 (vertical direction). In the following description, the direction orthogonal to the installation surface 21 (horizontal direction) is also described as a Y direction, and the direction parallel to the installation surface 21 (vertical direction) is also described as a Z direction.

The FOUP 5 includes a main body 5a having therein a space configured to store a transfer target object in the horizontal direction, and a FOUP door 6 configured to close an opening of the main body 5a. The transfer target object stored in the main body 5a is stably supported inside the main body 5a by a retainer (not shown) including a spring or the like. In the present embodiment, a relatively large thin transfer target object (e.g., a substrate with a planar size of 600 mm×600 mm or 515 mm×510 mm, and a thickness of 0.2 mm to 4.0 mm) having a rectangular shape (square shape) is used.

The load port 1 includes a plate-shaped base member 30. The base member 30 constitutes one wall surface of the load port 1. The load port 1 is fixed to the semiconductor processing apparatus 20 with a back surface of the base member 30 being in contact with the installation surface 21. The base member 30 has an opening 30a via which the transfer target object is loaded and unloaded, and a mounting table 10 extending in the horizontal direction is installed below the opening 30a. As shown in FIG. 2, the mounting table 10 is supported by two mounting plates 10a, which are spaced apart from each other in the horizontal direction.

The mounting table 10 supports the FOUP 5 by the FOUP support mechanism 11 on its upper surface. The FOUP support mechanism 11 is configured to be capable of reciprocating in the Y direction while fixing the FOUP 5 supported thereon, and may move the FOUP 5 toward or away from the semiconductor processing apparatus 20.

The door member 12, which is a member capable of opening and closing the opening 30a, includes a load port door 120 configured to hold the FOUP door 6 of the FOUP 5, a connection member 121 fixed to a lower end of the load port door 120, two arm members 122 fixed to the connection member 121, and a holding member 122a configured to connect and hold the two arm members 122.

The load port door 120 is a substantially rectangular member having approximately the same size as the FOUP door 6 of the FOUP 5, and is provided with a door holding portion 120a configured to hold the FOUP door 6. The connection member 121 is a member that connects the load port door 120 and the arm member 122. As will be described below, the arm member 122 is a rectangular member extending in the Y direction.

As shown in FIG. 3, an insertion opening 31 extending in the Z direction is formed in the base member 30. Each of the two arm members 122 extends from a back surface side to a front surface side of the base member 30 via the insertion opening 31. FIG. 3 shows the front surface side of the base member 30. Each of the two arm members 122 is connected to a drive member 32 that moves up and down on the front surface side of the base member 30, and is configured to hold the load port door 120 on the back surface side of the base member 30. Each of the arm members 122 moves in the Y direction along the insertion opening 31.

Two guides 33, a ball screw 34, and a lifting motor 35 are fixed to the surface of the base member 30. The two guides 33 extend in the Z direction along two insertion openings 31 outside the two insertion openings 31. The ball screw 34 extends in the Z direction between the two guides 33. An upper end portion of the ball screw 34 is rotatably supported by a support member 34a1, and a lower end portion thereof is rotatably supported by a support member 34a2.

The lifting motor 35 is a stepping motor, and a rotary shaft 35a thereof is connected to a drive shaft 34a formed at the lower end portion of the ball screw 34 via a belt 36. Therefore, when the rotary shaft 35a of the lifting motor 35 is rotationally driven, the rotation is transmitted to the drive shaft 34a of the ball screw 34 such that the ball screw 34 is rotationally driven.

The drive member 32 is a plate-shaped member extending along the surface of the base member 30, and both ends thereof are engaged with the two guides 33. The drive member 32 has a screw hole (not shown) that rotatably supports the ball screw 34, and is connected to the ball screw 34 via the screw hole. Therefore, when the ball screw 34 is rotationally driven, rotational movement of the ball screw 34 is converted into linear movement in the vertical direction such that the drive member 32 moves in the Z direction along the two guides 33.

In the load port 1 of the present embodiment, when the rotary shaft 35a of the lifting motor 35 is rotationally driven in a predetermined direction, the drive member 32 moves downward along the Z direction. When the rotary shaft 35a of the lifting motor 35 is rotationally driven in a direction opposite to the predetermined direction, the drive member 32 moves upward along the Z direction. Therefore, in the present embodiment, the lifting motor 35, the belt 36, and the ball screw 34 constitute a driver T configured to move the drive member 32 in the Z direction.

Figure 4:
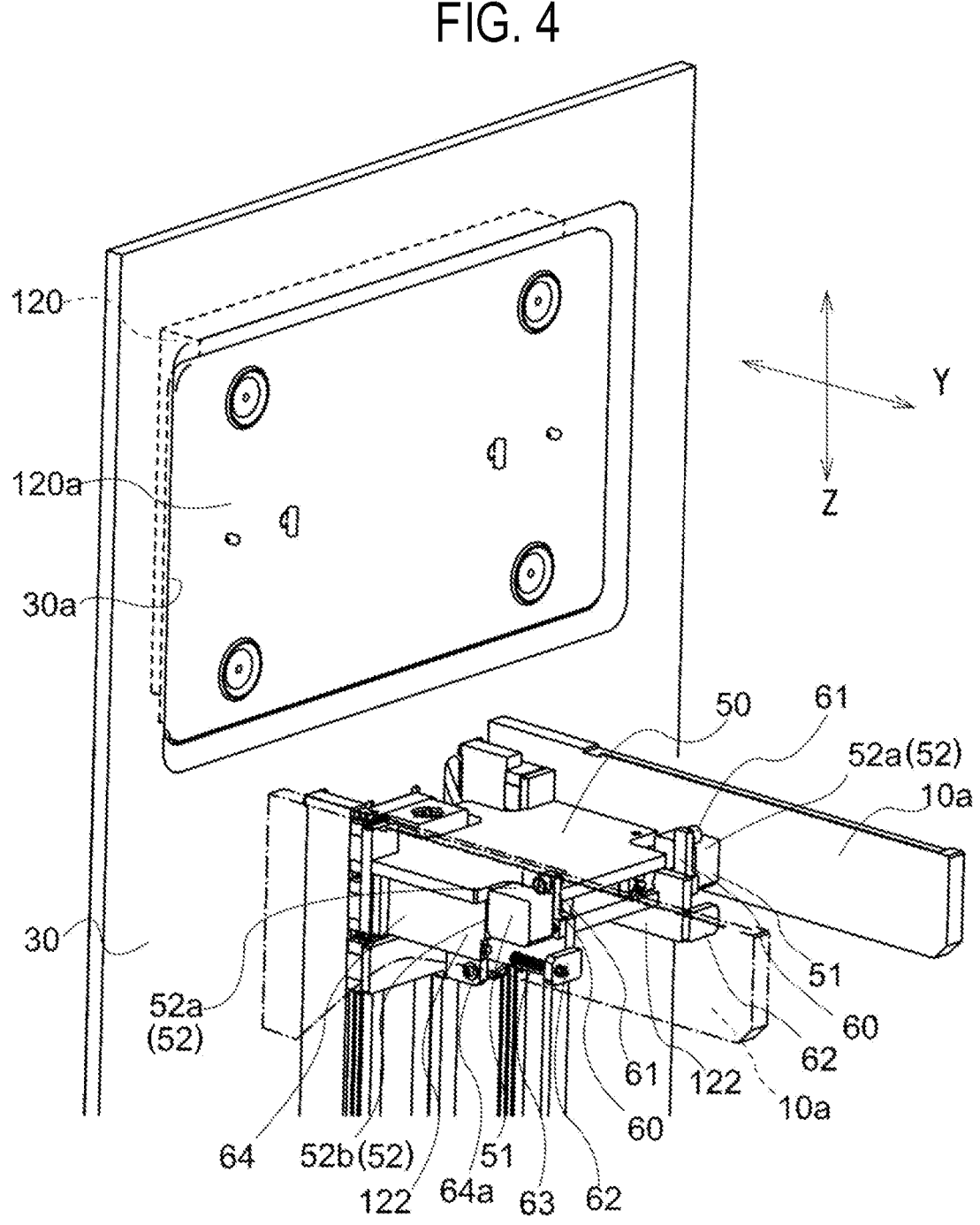
FIG. 4 is a perspective view showing the FOUP support mechanism disposed on an upper surface of the mounting table of the load port in a separated state.

As shown in FIG. 4, the two mounting plates 10a are connected by a connection member 50, which is disposed in the horizontal direction, and are formed as one piece. Two guide members 51 having a substantially rectangular parallelepiped shape are provided outside a distal end side (a side away from the base member 30) of the connection member 50. The guide members 51 are disposed inside the mounting plates 10a on both sides of the distal end side of the connection member 50.

Figure 5:
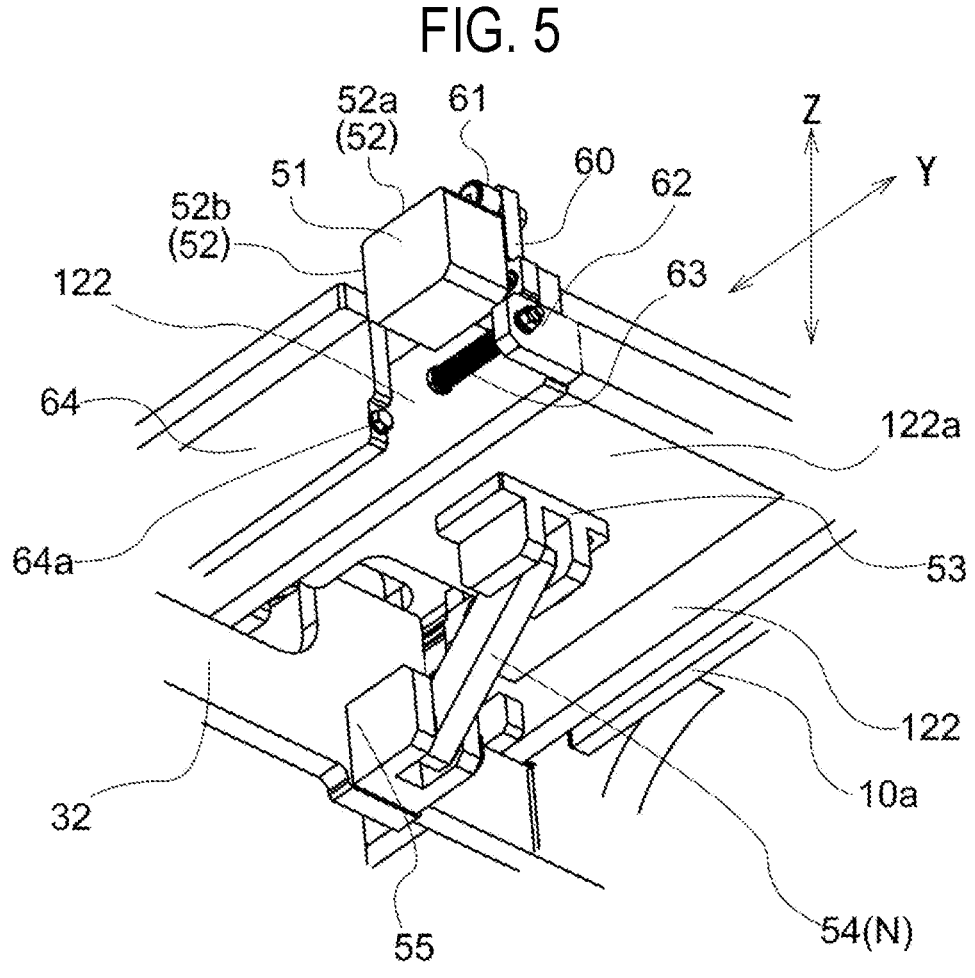
FIG. 5 is a perspective view illustrating a link member that connects a door member and a drive member.
Figure 6:
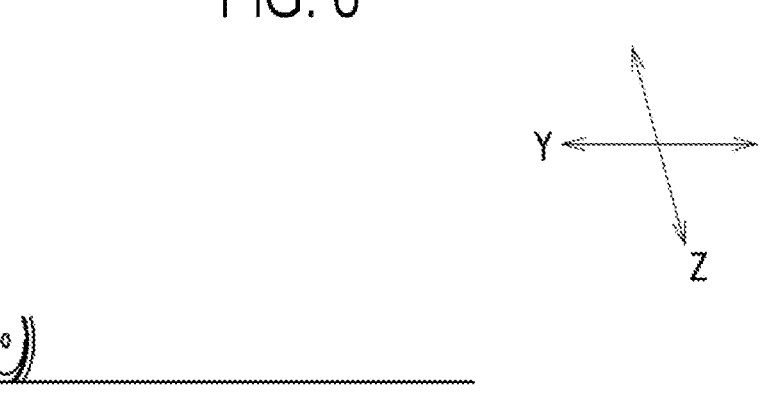
FIG. 6 is a perspective view illustrating the link member that connects the door member and the drive member.
Figure 6:
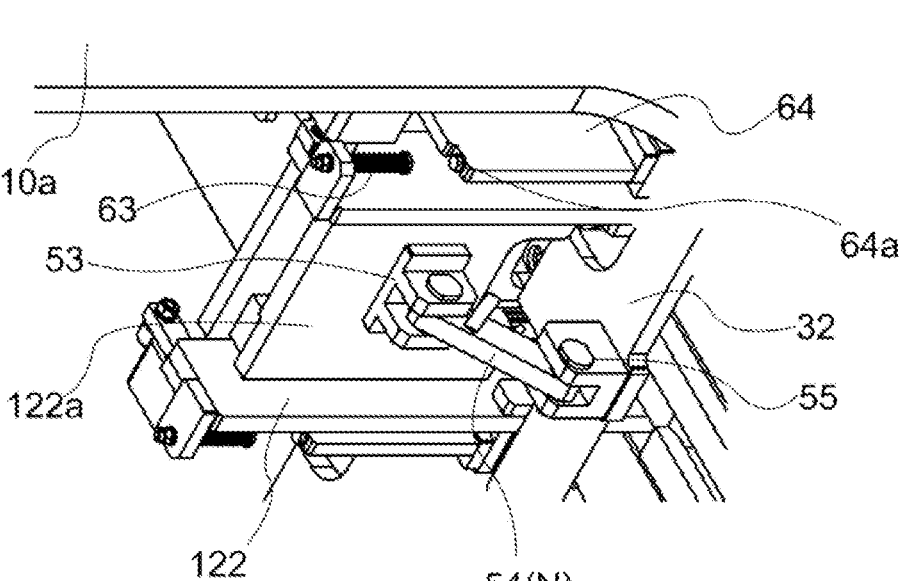

The two arm members 122 are respectively disposed along the mounting plates 10a between the two mounting plates 10a. As shown in FIGS. 5 and 6, the two arm members 122 are connected by a holding member 122a, which is disposed in the horizontal direction, and are formed as one piece. An upper end of a link member 54 is rotatably installed at a lower surface of the holding member 122a (door member 12) via an installation member 53. At a lower end of the drive member 32, a lower end of the link member 54 is rotatably installed via an installation member 55. In this way, both ends of the link member 54 are rotatably connected, and an inclination direction of the link member 54 (inclination direction of a longitudinal direction of the link member 54 with respect to the vertical direction) may be changed. In the present embodiment, a link mechanism N includes one link member 54.

Figure 7:
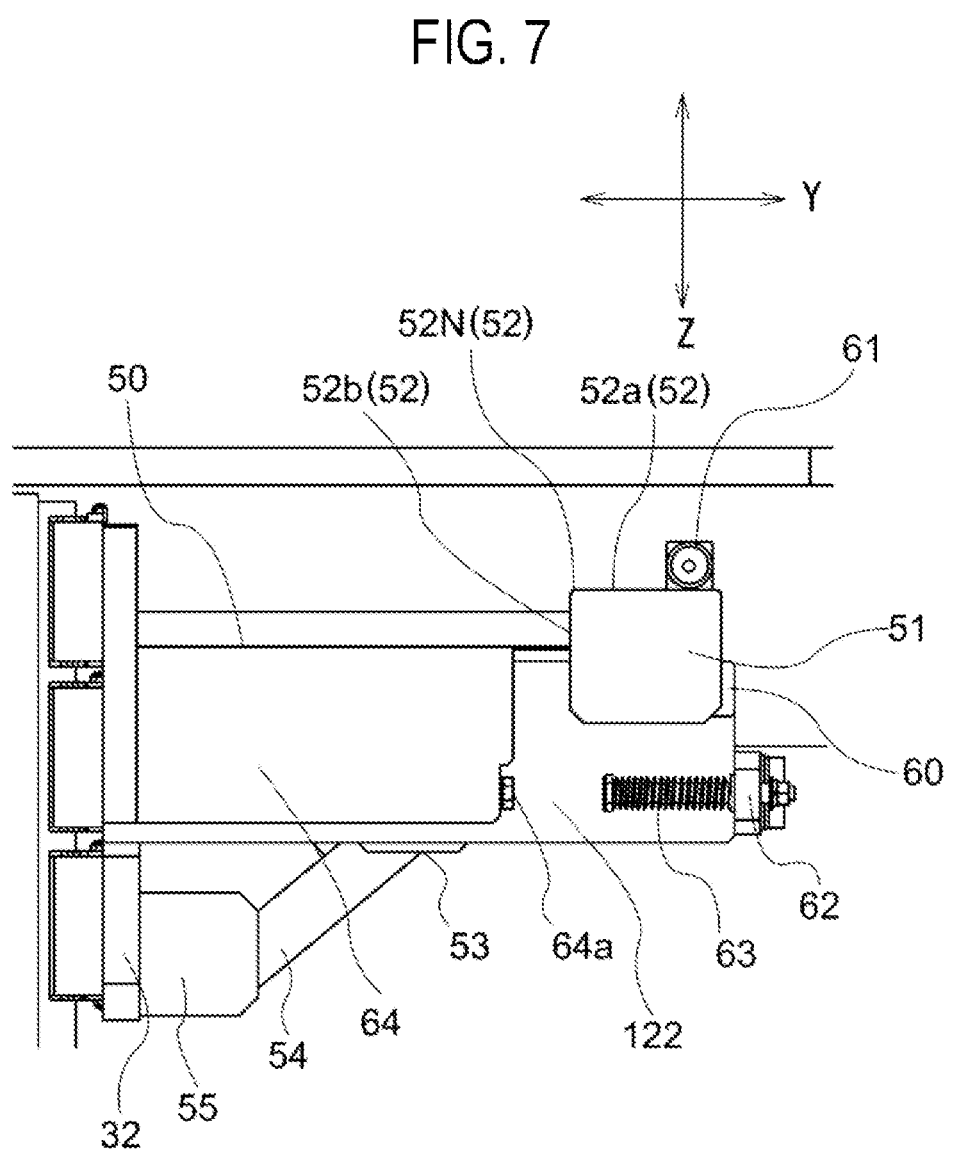

As shown in FIG. 7, a guide roller 61 is installed at an outer surface of a distal end side (a side away from the base member 30) of the arm member 122 via a roller holding portion 60. The roller holding portion 60 is installed at the upper end of the arm member 122 and protrudes upward from the upper end of the arm member 122. The guide roller 61 is rotatably installed at the upper end of the roller holding portion 60. Therefore, the guide roller 61 is disposed above the upper end of the arm member 122.

Further, a spring 63 is installed at a front end surface of the arm member 122 via a spring holding member 62. The spring 63 is disposed along the outer surface of the arm member 122, and a longitudinal direction thereof is substantially parallel to the Y direction. The spring 63 is movable together with the door member 12.

A spring bearing plate 64 is disposed between the arm member 122 and the mounting plate 10a. A spring bearing portion 64a is formed at a lower portion of a front end surface (a surface away from the base member 30) of the spring bearing plate 64. A distance between an outer peripheral surface of the arm member 122 and an inner peripheral surface of the spring bearing plate 64 and a distance between the outer peripheral surface of the arm member 122 and an axial center of the spring 63 are approximately equal to each other. Therefore, when the arm member 122 moves in the Y direction in a state in which the spring 63 and the spring bearing portion 64a are spaced apart, the spring 63 comes into contact with the spring bearing portion 64a. The spring bearing plate 64 moves such that the guide roller 61 approaches the guide connection portion 52N. When a distance between the guide roller 61 and the guide connection portion 52N is a predetermined distance (i.e., a distance between the guide roller 61 and the guide connection portion 52N when the guide roller 61 reaches a position just before the guide connection portion 52N), the spring bearing plate 64 is arranged at a position where the spring bearing plate 64 comes into contact with the spring 63.

In the present embodiment, a direction of the pressing force of the spring 63 acting on the guide roller 61 is opposite to a direction of door driving force that moves the FOUP door 6 (door member 12) in the Y direction. By moving the drive member 32 in the Z direction, the FOUP door 6 is moved in the Y direction. However, the pressing force of the spring 63 is smaller than the door driving force that moves the FOUP door 6 (door member 12) in the Y direction.

The guide roller 61 and the spring 63 are installed at the arm member 122 and are moved integrally with the arm member 122. Specifically, when the arm member 122 moves along the Y direction, the guide roller 61 and the spring 63 also move in the Y direction. When the arm member 122 moves along the Z direction, the guide roller 61 and the spring 63 also move in the Z direction.

An upper surface of the guide member 51 is a guide surface 52*a* that guides the guide roller 61 along the Y direction, and an end surface of the guide member 51 near the base member 30 is a guide surface 52*b* that guides the guide roller 61 along the Z direction. In the present embodiment, the guide surface 52*a* extending along the Y direction and the guide surface 52*b* extending along the Z direction are connected by the guide connection portion 52N. The guide surface 52*a*, the guide connection portion 52N, and the guide surface 52*b* constitute a guide surface 52.

Further, in the load port 1 of the present embodiment, a cover (not shown) is disposed below the mounting table 10 so as to cover each of the above-described members disposed on the front surface side of the base member 30.

In the load port 1 of the present embodiment, the guide roller 61 is installed at each of the two arm members 122, and the guide surface 52 is disposed for each of the two guide rollers 61. The two arm members 122 and the two guide surfaces 52 are arranged on both sides of the drive member 32, and the spring 63 is arranged on each of the guide surfaces 52 to guide the guide roller 61.

A door opening operation of opening the FOUP door 6 of the FOUP 5 in the load port 1 of the present embodiment will be described based on FIGS. 8A to 12C.

Figure 8A:
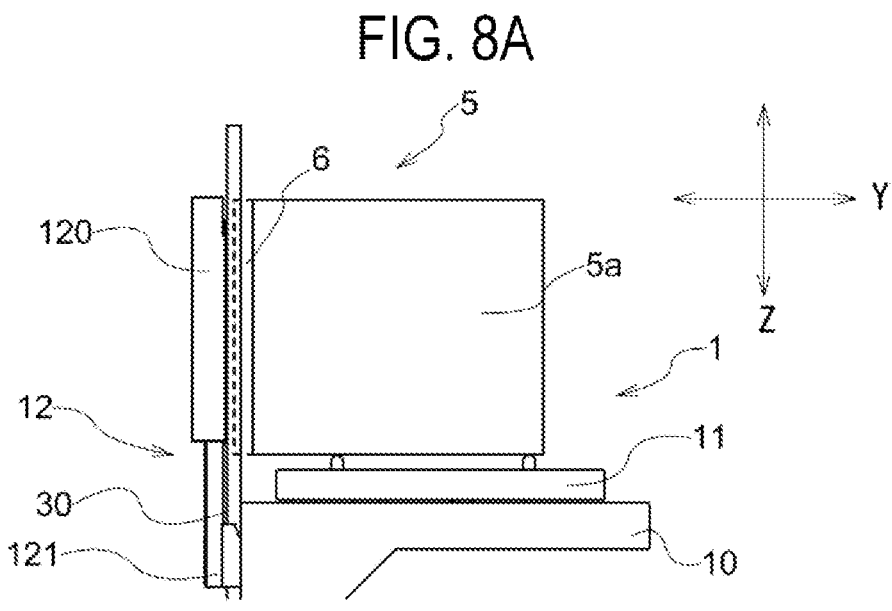
FIGS. 8A and 8B are side views showing a load port door in a closed state.

FIG. 8A shows the load port door 120 holding the FOUP door 6 of the FOUP 5 in a closed state. To show a state of the arm member 122 and the like at that time, illustration of the mounting plate 10*a* is omitted in FIG. 8B (the same applies in FIGS. 9B to 10B).

Figure 8B:
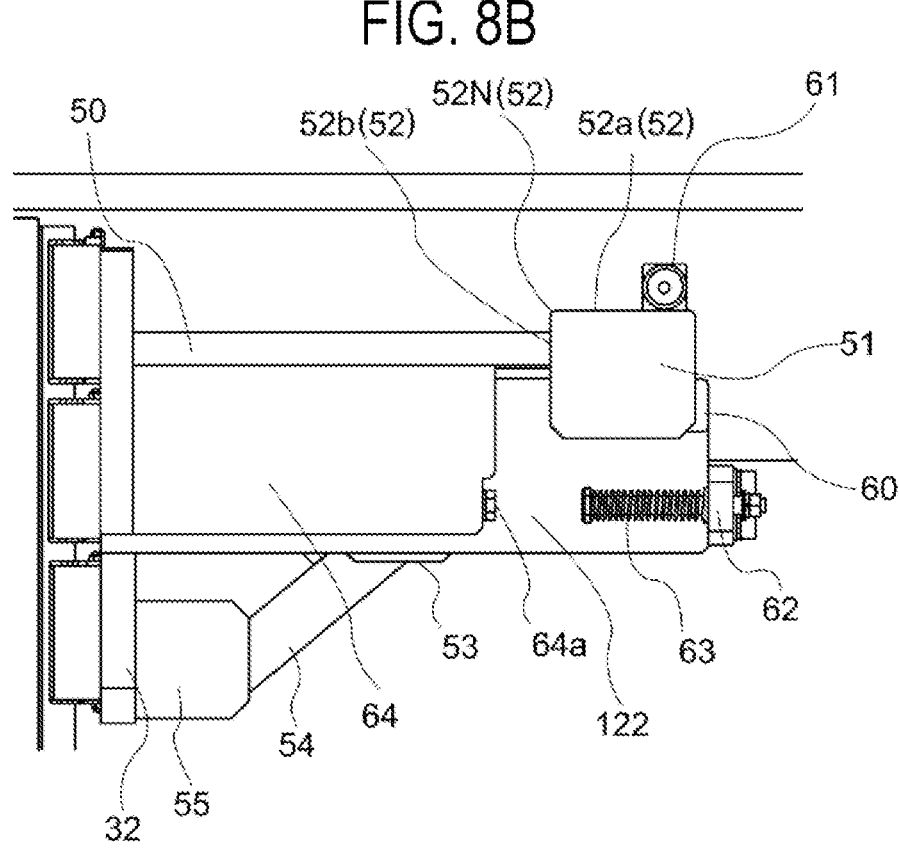

In a state in which the load port door 120 is closed, as shown in FIG. 8B, the guide roller 61 installed at the arm member 122 is disposed on a distal end side (a side away from the base member 30) of the guide surface 52*a* extending along the Y direction. At that time, the spring 63 installed at the arm member 122 is spaced apart from the spring bearing portion 64*a*.

In the load port 1, when the door opening operation of opening the FOUP door 6 of the FOUP 5 is started, the lifting motor 35 is driven to rotate the ball screw 34, thereby causing the drive member 32 to move down in the Z direction along the guide 33. At that time, the guide roller 61 is disposed on the guide surface 52*a* extending along the Y direction. Therefore, the guide roller 61 may not move downward, but moves on the guide surface 52*a* in the Y direction toward the base member 30.

As the guide roller 61 moves, the link member 54 reduces an inclination with respect to the vertical direction while rotating with respect to the installation member 53 installed at the holding member 122*a* configured to hold the two arm members 122 and the installation member 55 installed at the drive member 32. At that time, the spring 63 installed at the arm member 122 moves toward the spring bearing portion 64*a*.

Figure 9A:
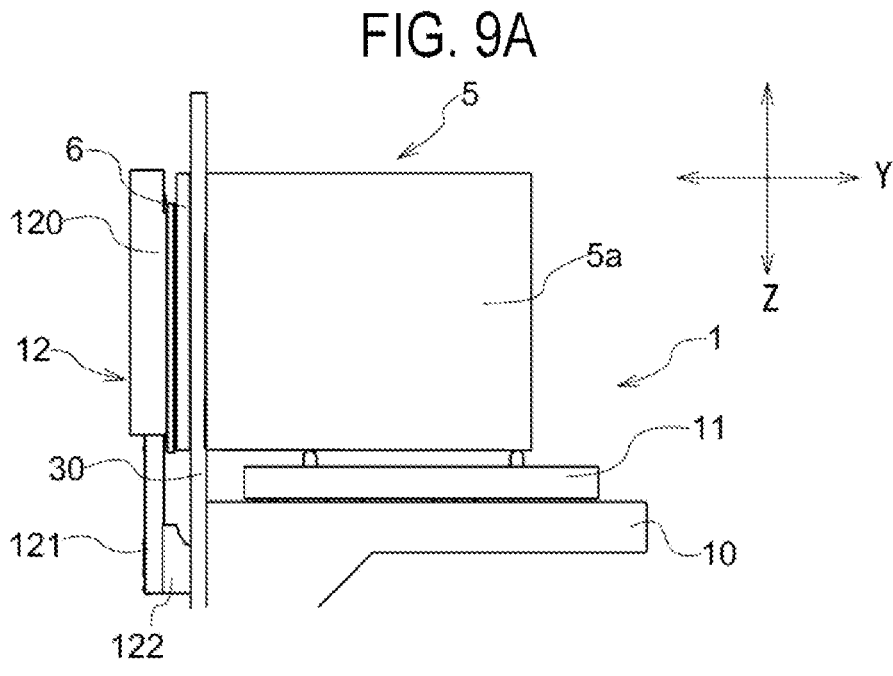
FIGS. 9A and 9B are side views showing the load port door moved in the Y direction.
Figure 9B:
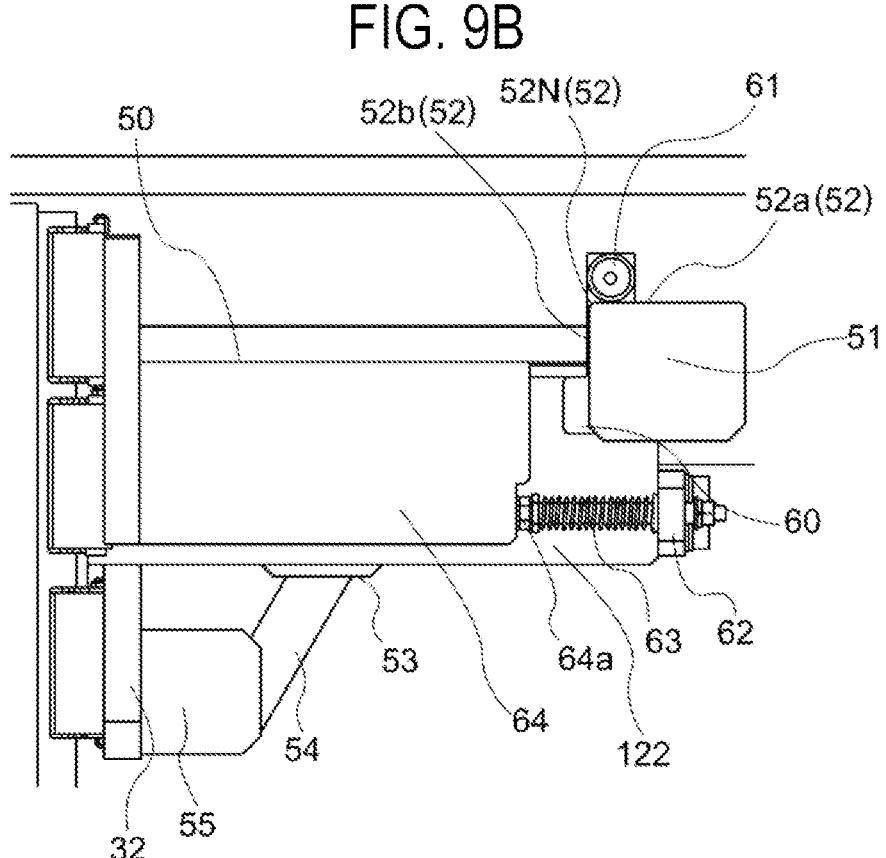

In addition, when the drive member 32 moves down along the guide 33, the guide roller 61 moves toward the base member 30 in the Y direction on the guide surface 52*a* extending along the Y direction, and as shown in FIG. 9B, reaches the position just before the guide connection portion 52N. At that time, the spring 63 installed at the arm member 122 comes into contact with the spring bearing portion 64*a*. As shown in FIG. 9A, the FOUP door 6 is opened by moving within the opening 30*a* of the base member 30 in the Y direction.

Figure 10A:
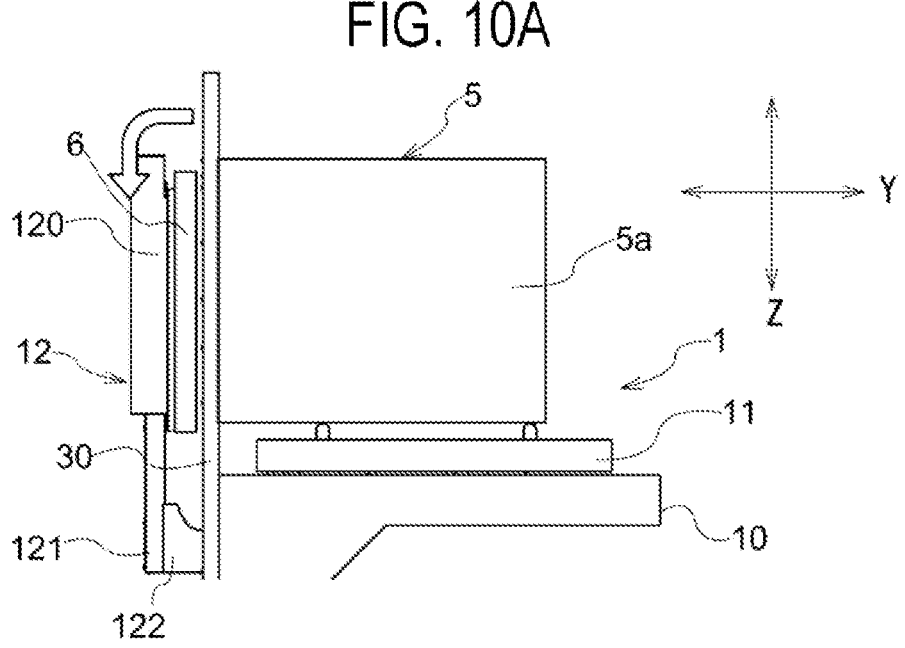
FIGS. 10A and 10B are side views showing the load port door moved in the Z direction.
Figure 10B:
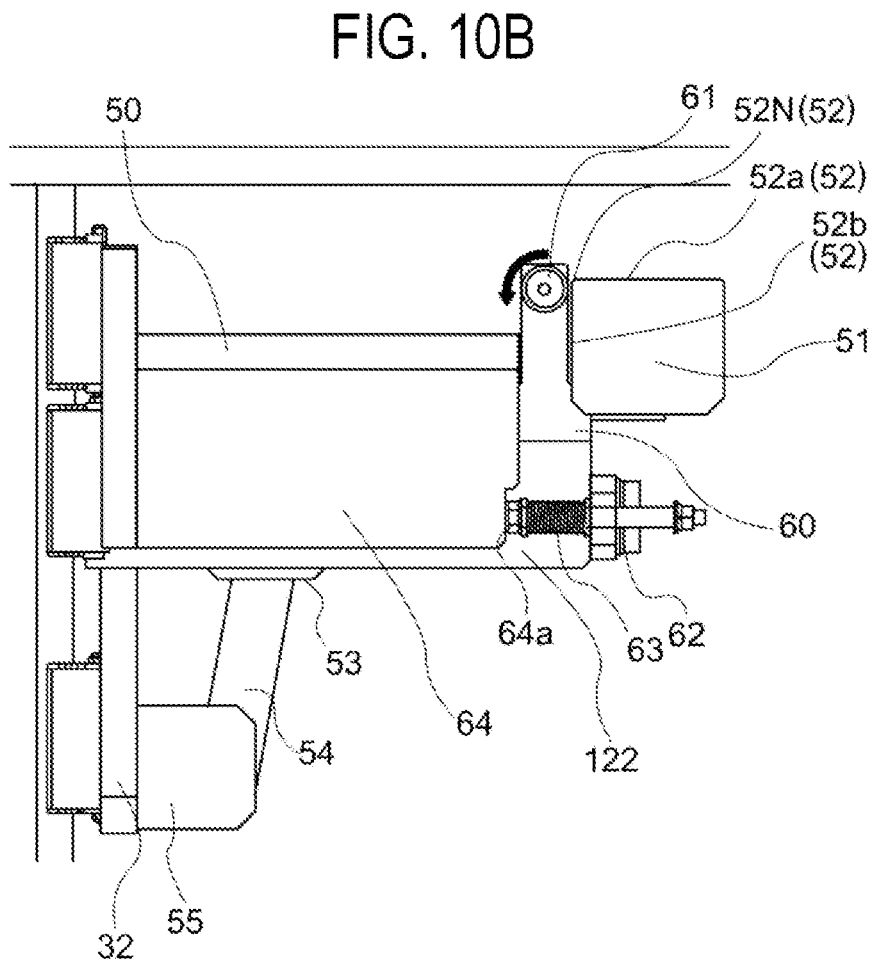

Subsequently, as the drive member 32 continues to move down along the guide 33, the spring 63 installed at the arm member 122 contracts, and the guide roller 61 moves over the guide connection portion 52N. As shown in FIG. 10B, the guide roller 61 moves from the guide surface 52*a* extending along the Y direction to the guide surface 52*b* extending along the Z direction. At that time, as the guide roller 61 moves, the link member 54 reduces the inclination with respect to the vertical direction, and the FOUP door 6 moves in the Z direction as shown in FIG. 10A.

Figure 11:
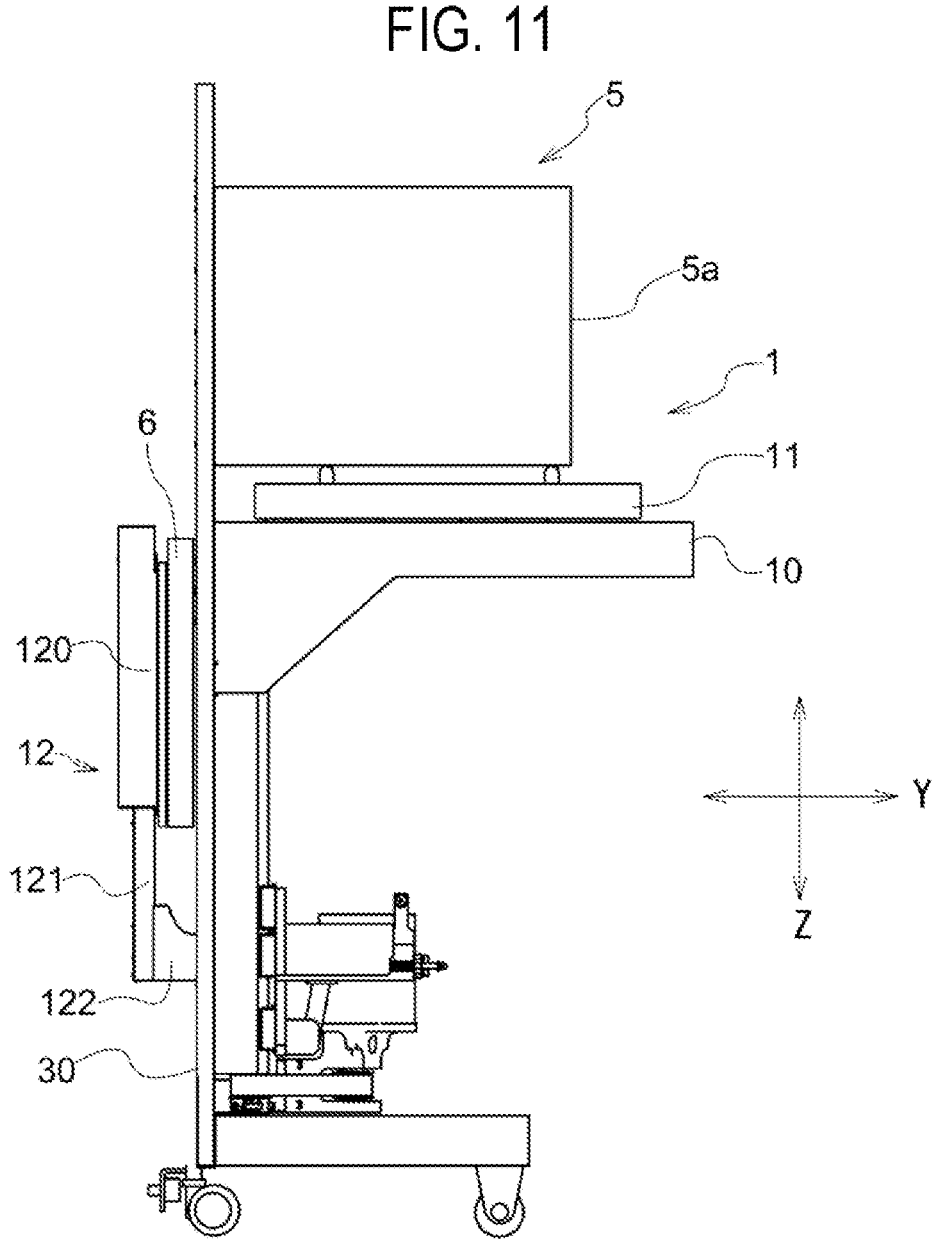
FIG. 11 is a side view showing the load port door lowered in the Z direction.

Thereafter, when the drive member 32 moves down along the guide 33, the guide roller 61 moves down in the Z direction along the guide surface 52*b* extending along the Z direction. At that time, the link member 54 does not change the inclination with respect to the vertical direction as the guide roller 61 moves. The contracted length of the spring 63 installed at the arm member 122 also does not change. The FOUP door 6 moves in the Z direction as shown in FIG. 11.

An operation when the guide roller 61 moves over the guide connection portion 52N will be explained based on FIGS. 12A to 12C.

Figures 12A, 12B:
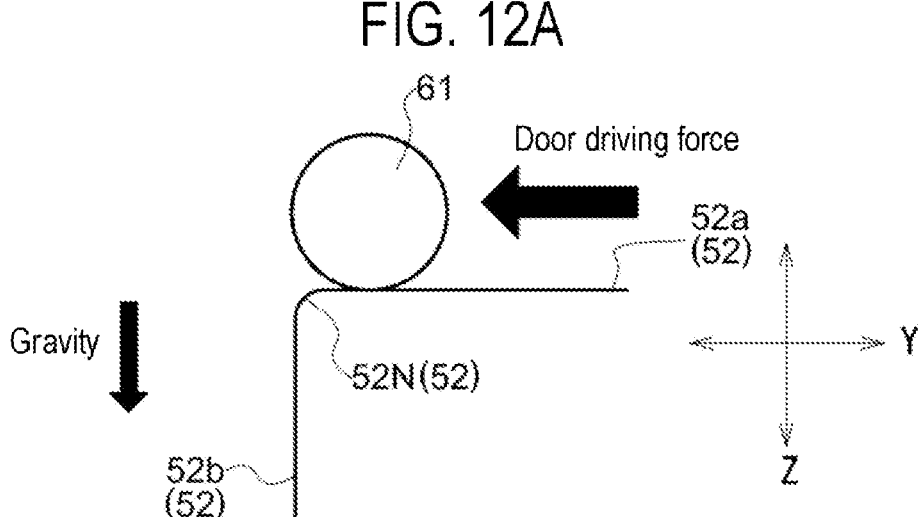

FIG. 12A shows that as shown in FIG. 9B, the guide roller 61 moves on the guide surface 52*a* extending along the Y direction and reaches the position just before the guide connection portion 52N. At that time, the spring 63 installed at the arm member 122 contacts the spring bearing portion 64*a*. Since the spring 63 is not contracted, the pressing force of the spring 63 is not applied to the guide roller 61.

In the present embodiment, the guide surface 52*a* extending along the Y direction is a plane extending in the horizontal direction, and the guide surface 52*b* extending along the Z direction is a plane extending in the vertical direction. The guide connection portion 52N connecting the guide surface 52*a* and the guide surface 52*b* is formed in an R shape (curved surface shape) such that the guide roller 61 may move smoothly from the guide surface 52*a* to the guide surface 52*b*.

FIG. 12B shows a state in which the guide roller 61 moves on the guide connection portion 52N. A portion of the lower end of the guide roller 61 is disposed below the guide surface 52*a* extending along the Y direction. At that time, the spring 63 installed at the arm member 122 is contracted by contacting the spring bearing portion 64*a*, such that the pressing force of the spring 63 acts on the guide roller 61 along the Y direction. Since the guide roller 61 moves while being pressed against the guide connection portion 52N, a portion of the lower end of the guide roller 61 moves while being in contact with the guide connection portion 52N. Therefore, even in a case where there is an appropriate clearance in the link mechanism N, a gap is not formed between the guide roller 61 and the guide connection portion 52N.

Figure 12C:
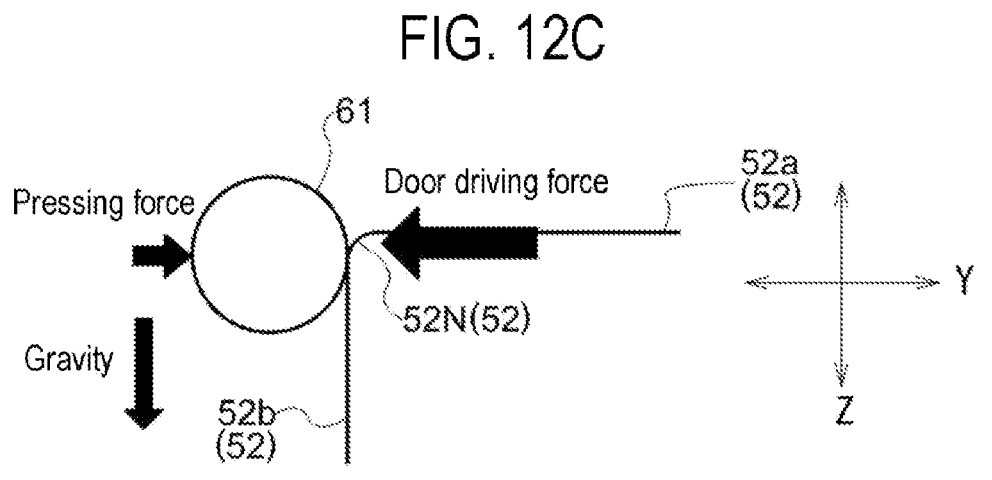

FIG. 12C shows a state in which the guide roller 61 has moved over the guide connection portion 52N as shown in FIG. 10B. At that time, the contracted length of the spring 63 installed at the arm member 122 becomes larger than that shown in FIG. 12B, such that the pressing force of the spring 63 acting on the guide roller 61 increases.

In the present embodiment, when the guide roller 61 moves on the guide connection portion 52N, the pressing force of the spring 63 acting on the guide roller 61 gradually increases. When the guide roller 61 moves over the guide connection portion 52N, the contracted length of the spring 63 becomes maximum, and the pressing force of the spring 63 becomes maximum.

In the door closing operation of closing the FOUP door 6 of the FOUP 5, the lifting motor 35 is driven in the opposite direction to the direction in the above-mentioned opening operation, and the ball screw 34 is rotated in the reverse direction. Thus, the drive member 32 moves upward along the guide 33, and the load port door 120 holding the FOUP door 6 of the FOUP 5 moves upward. At that time, the link member 54 moves upward from the state shown in FIG. 11 to the states shown in FIGS. 10A and 10B without changing the inclination. The guide roller 61 moves in the vertical direction on the guide surface 52b extending along the Z direction and reaches the position just before the guide connection portion 52N.

Further, when the drive member 32 moves upward along the guide 33, the guide roller 61 moves over the guide connection portion 52N from the guide surface 52b extending along the Z direction to the guide surface 52a extending along the Y direction so as to come into the states shown in FIGS. 9A and 9B. Thereafter, in the closing operation of the FOUP door 6, when the guide roller 61 moves along the Y direction, the link member 54 increases the inclination with respect to the vertical direction, and the spring 63 installed at the arm member 122 is spaced apart from the spring bearing portion 64a. At that time, the states shown in FIGS. 8A and 8B are achieved, and the load port door 120 holding the FOUP door 6 of the FOUP 5 is closed.

As described above, the load port 1 according to the present embodiment includes: a plate-shaped base member 30 having an opening 30a via which a transfer target object is loaded and unloaded; a door member 12 capable of opening and closing the opening 30a; a link mechanism N including a link member 54 having one end rotatably connected to the door member 12; a guide roller 61 configured to move together with the door member 12; a guide surface 52 bent to extend from a Y direction to a Z direction and configured to guide the guide roller 61; a drive member 32 to which the other end of the link member 54 is rotatably connected; and a driver T configured to move the drive member 32 in the Z direction, wherein the link mechanism N is configured to allow the guide roller 61 to move along the guide surface 52 from the Y direction to the Z direction or from the Z direction to the Y direction while the other end of the link member 54 is moving in the Z direction, and a spring 63 (presser) is provided to press the guide roller 61 toward the guide connection portion 52N when the guide roller 61 passes through a guide connection portion 52N that connects a guide surface 52a (first guide surface) extending along the Y direction and a guide surface 52b (second guide surface) extending along the Z direction.

According to this configuration, when the guide roller 61 passes through the guide connection portion 52N that connects the guide surface 52a extending along the Y direction and the guide surface 52b extending along the Z direction, the guide roller 61 is pressed toward the guide connection portion 52N. Therefore, the guide roller 61 passes through the guide connection portion 52N while being in contact with the guide connection portion 52N. As a result, a gap is not formed between the guide roller 61 and the guide connection portion 52N, which makes it possible to suppress vibration of the FOUP door 6 when opening and closing the FOUP door. Accordingly, it is possible to prevent generation of noise, falling of the FOUP door, acceleration of wear of the guide roller 61, generation of cracks in the guide roller 61, resonance of the guide roller 61 with other parts, or generation of particles, which may be caused by the vibration of the FOUP door 6. Therefore, the door opening/closing speed may be improved, and the door opening/closing operation time may be shortened.

In the load port 1 according to the present embodiment, the presser includes a spring 63 disposed along the Y direction.

According to this configuration, the presser configured to press the guide roller 61 toward the guide connection portion 52N may be easily disposed relative to the load port 1.

In the load port 1 according to the present embodiment, the spring 63 is movable together with the door member 12, and a spring bearing plate 64 is disposed at a position where the spring bearing plate 64 comes into contact with the spring 63 when the guide roller 61 moves so as to be close to the guide connection portion 52N and a distance between the guide roller 61 and the guide connection portion 52N becomes a predetermined distance.

According to this configuration, the spring 63 is installed at the door member 12 on the moving side, making it easier to replace the spring 63 as compared to a case where the spring 63 is installed at the member on the non-moving side.

In the load port 1 according to the present embodiment, the pressing force of the spring 63 is smaller than the driving force that moves the door member 12 in the Y direction when the drive member 32 moves in the Z direction.

According to this configuration, even when the spring 63 is disposed, there is almost no need to increase the driving force that moves the door member 12 in the Y direction.

In the load port 1 according to the present disclosure, two guide surfaces 52 are arranged on both sides of the drive member 32, and the spring 63 is arranged on each of the two guide surfaces 52.

According to this configuration, the guide roller 61 provided at one end of the link member 54 is pressed equally against the two guide surfaces 52, which makes it possible to prevent the FOUP door 6 from being tilted. This configuration is particularly effective in the case where the FOUPs and the FOUP doors have become larger in size, heavier in weight, and larger in vibration due to the recent increase in the size of transfer target objects (e.g., substrates).

Second Embodiment

A difference between a load port 101 of the present embodiment and the load port 1 of the first embodiment is as follows. In the load port 1 of the first embodiment, the guide roller 61 is guided by the guide member 51 when the arm member 122 moves down in the Z direction during the door opening operation. Meanwhile, in the load port 101 of the present embodiment, the guide roller 61 is guided by the guide member 51 and then guided by the guide member 151 when the arm member 122 moves down in the Z direction during the door opening operation. Further, in the configuration of the load port 101, detailed description of the same parts as those of the load port 1 will be omitted.

Figure 13:
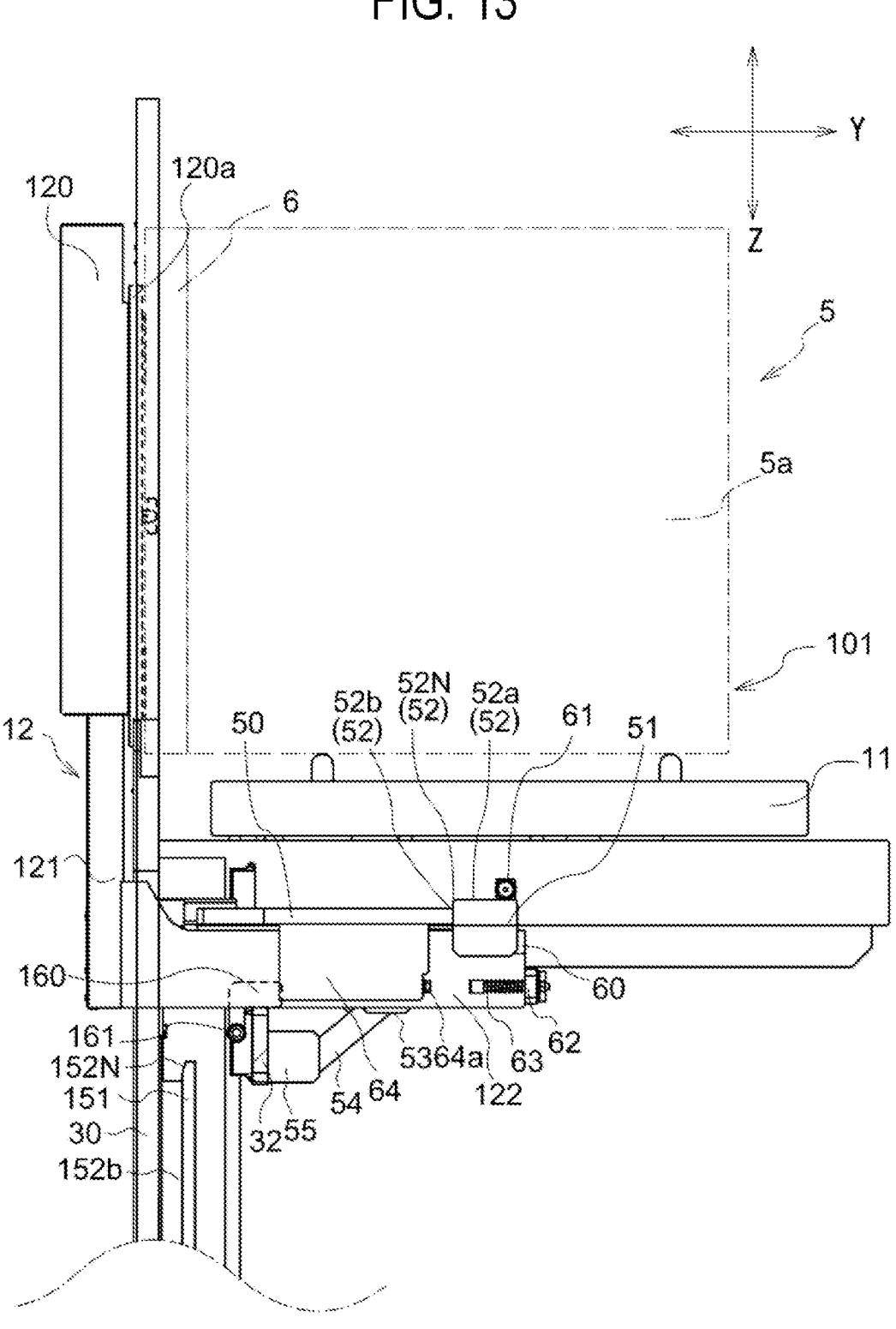
FIG. 13 is a side view illustrating a configuration of a door member of a load port according to a second embodiment of the present disclosure.

As shown in FIG. 13, in the load port 101 of the present embodiment, a guide roller 61 is installed at an outer surface of a distal end side (a side away from the base member 30) of the arm member 122 via a roller holding portion 60, and a guide roller 161 is installed at an inner surface of a proximal end side (a side closer to the base member 30) of the arm member 122 via a roller holding portion 160. In addition, in FIG. 13, illustration of the mounting plate 10*a* and the like is omitted to show a state of the arm member 122 and the like.

The roller holding portion 160 is installed at the lower end of the arm member 122 to protrude downward from the lower end of the arm member 122. The guide roller 161 is rotatably installed at the lower end of the roller holding portion 160. Therefore, the guide roller 161 is disposed below the lower end of the arm member 122.

The guide roller 161 is installed at the arm member 122 to move integrally with the arm member 122. Specifically, when the arm member 122 moves along the Y direction, the guide roller 161 also moves in the Y direction. When the arm member 122 moves along the Z direction, the guide roller 161 also moves in the Z direction.

A guide member 151 is disposed near the surface of the base member 30. The guide member 151 is a plate-shaped member extending in the vertical direction. The guide member 151 is disposed at approximately the same position as the guide roller 161 in a width direction of the load port 101.

An end surface of the guide member 151 near the base member 30 is a guide surface 152*b* that guides the guide roller 161 along the Z direction. In the present embodiment, an inclined surface portion 152N is formed at the upper end of the guide surface 152*b* extending along the Z direction. The inclined surface portion 152N is formed so that the guide roller 161 comes into smooth contact with the guide member 151. The inclined surface portion 152N is inclined so as to approach the base member 30 as it goes downward. The inclined surface portion 152N may be formed in an R shape (curved surface shape).

In the load port 101 of the present embodiment, the guide roller 61 and the guide roller 161 are installed at the two arm members 122. The guide members 51 are respectively disposed with respect to the two guide rollers 61, and the guide members 151 are respectively disposed with respect to the two guide rollers 161.

The door opening operation of opening the FOUP door 6 of the FOUP 5 in the load port 101 of the present embodiment will be described based on FIGS. 14A to 19B.

Figure 14A:
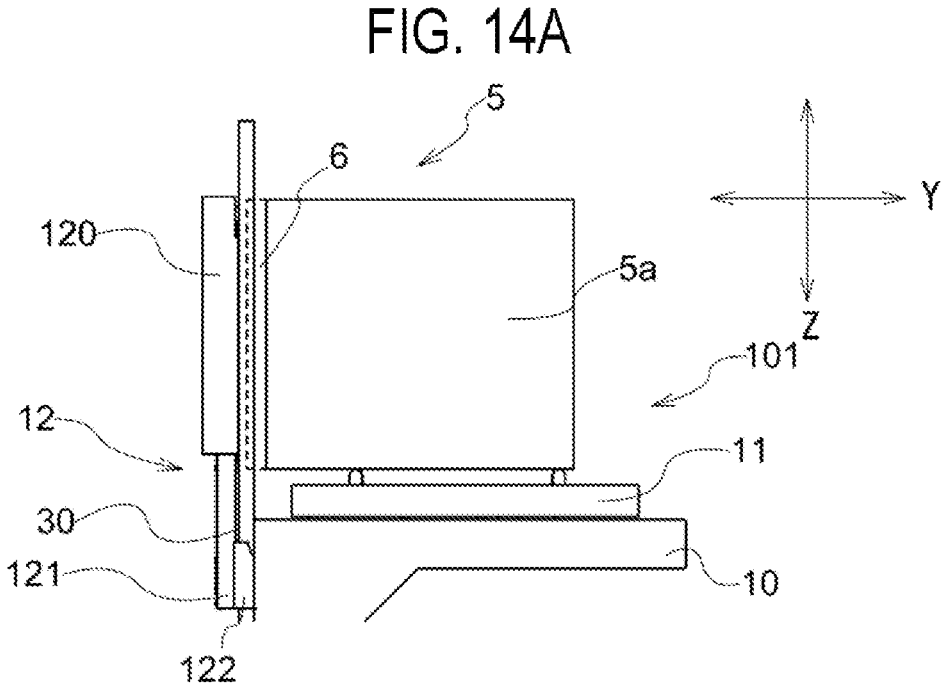
FIGS. 14A and 14B are side views showing the load port door in a closed state.
Figure 14B:
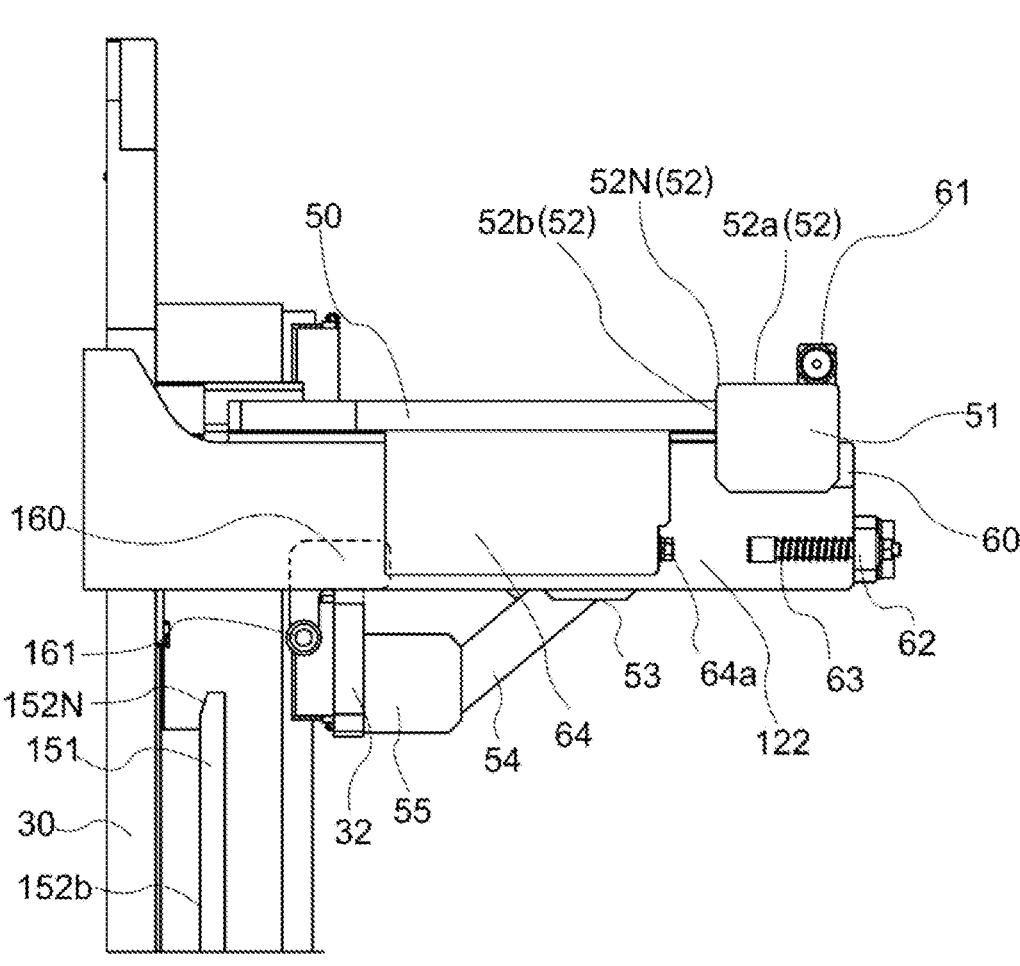

FIG. 14A shows the load port door 120 holding the FOUP door 6 of the FOUP 5 in a closed state. In FIG. 14B, illustration of the mounting plate 10*a* is omitted to show the state of the arm member 122 and the like at that time (the same applies in FIGS. 15B to 19B).

In a state in which the load port door 120 is closed, as shown in FIG. 14B, the guide roller 61 installed at the arm member 122 is disposed on a distal end side (a side away from the base member 30) of the guide surface 52*a* extending along the Y direction. At that time, the spring 63 installed at the arm member 122 is spaced apart from the spring bearing portion 64*a*. In addition, the guide roller 161 installed at the arm member 122 is located at a distal end side (a side away from the base member 30) of the guide member 151 extending along the Z direction and is spaced apart from the guide member 151.

In the load port 101, when the door opening operation of opening the FOUP door 6 of the FOUP 5 is started, the lifting motor 35 is driven to rotate the ball screw 34, thereby causing the drive member 32 to move down in the Z direction along the guide 33. At that time, the guide roller 61 cannot move downward because it is installed at the guide surface 52*a* extending along the Y direction, but begins to move on the guide surface 52*a* extending along the Y direction toward the base member 30 in the Y direction.

As the guide roller 61 moves, the link member 54 reduces the inclination with respect to the vertical direction while rotating with respect to the installation member 53 installed at the holding member 122*a* that holds the two arm members 122 and the installation member 55 installed at the drive member 32. At that time, the spring 63 installed at the arm member 122 moves toward the spring bearing portion 64*a*.

Figure 15A:
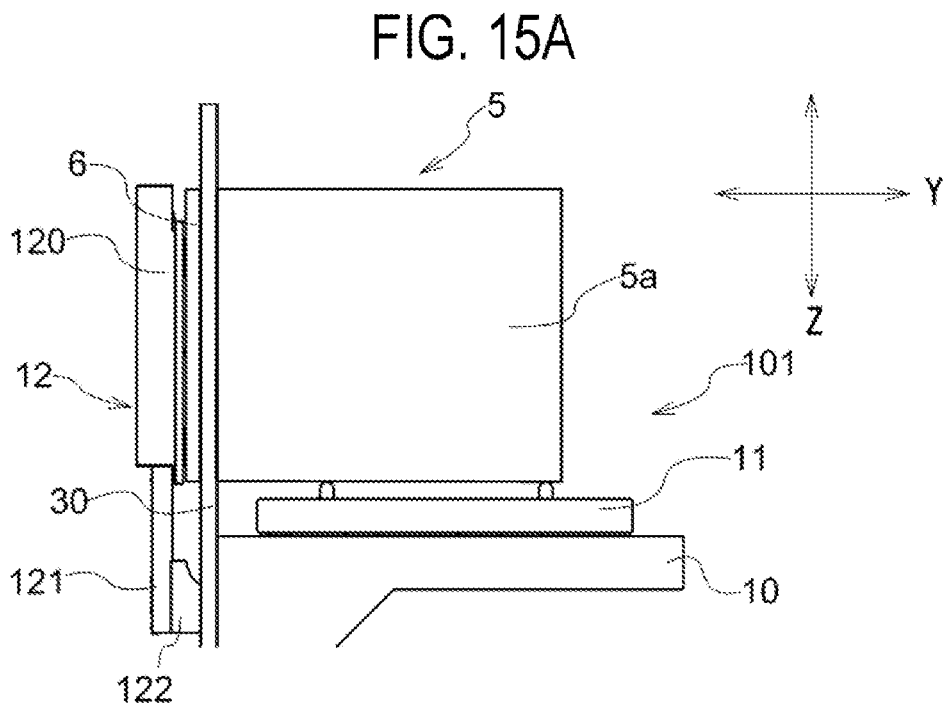
FIGS. 15A and 15B are side views showing the load port door moved in the Y direction.
Figure 15B:
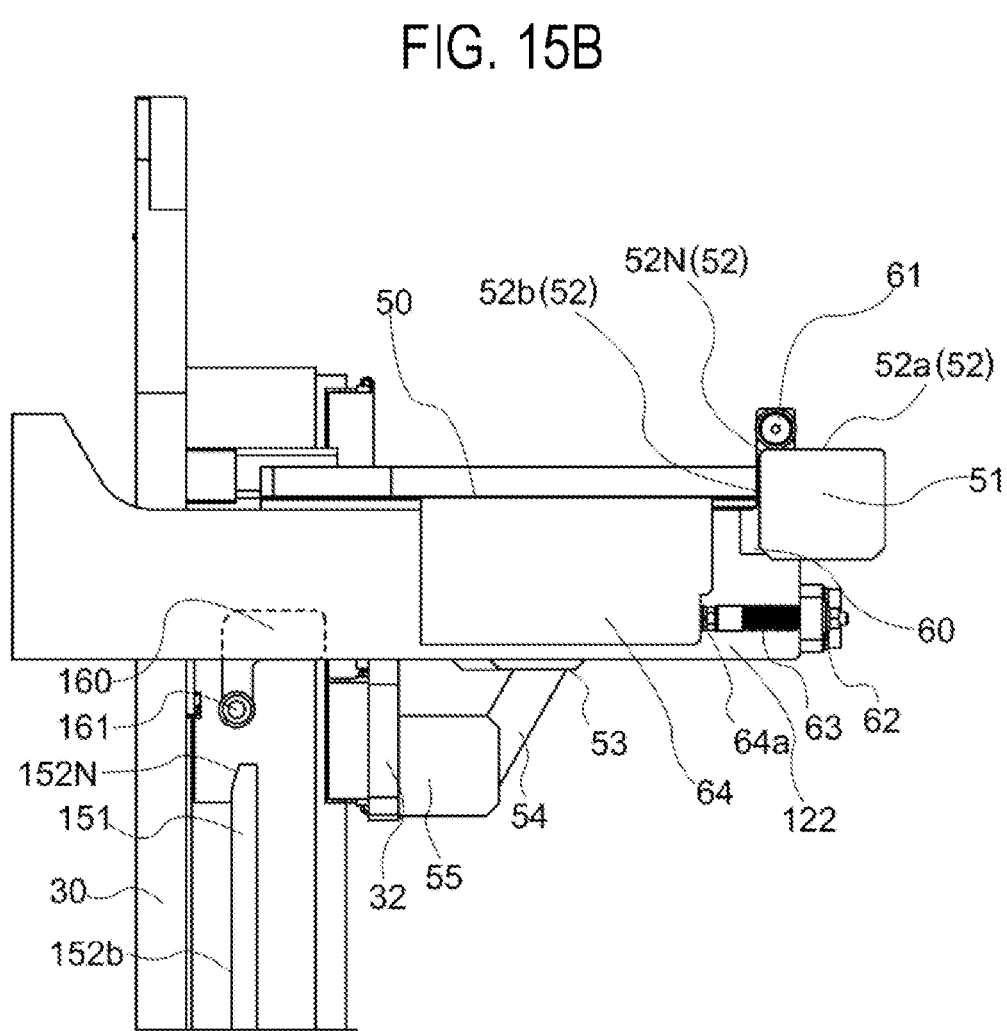

Further, when the drive member 32 moves down along the guide 33, the guide roller 61 moves toward the base member 30 in the Y direction on the guide surface 52*a* extending along the Y direction and reaches the position just before the guide connection portion 52N as shown in FIG. 15B. At that time, the spring 63 installed at the arm member 122 comes into contact with the spring bearing portion 64*a*. As shown in FIG. 15A, the FOUP door 6 is opened by moving within the opening 30*a* of the base member 30 in the Y direction.

Figure 16A:
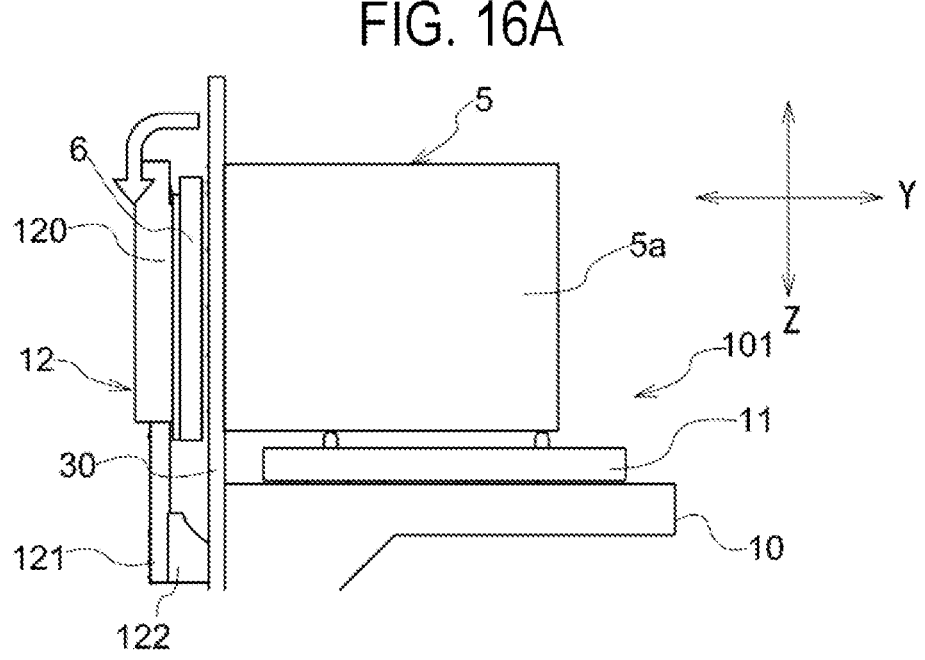
FIGS. 16A and 16B are side views showing a state in which the guide roller moves along the guide connection portion.
Figure 16B:
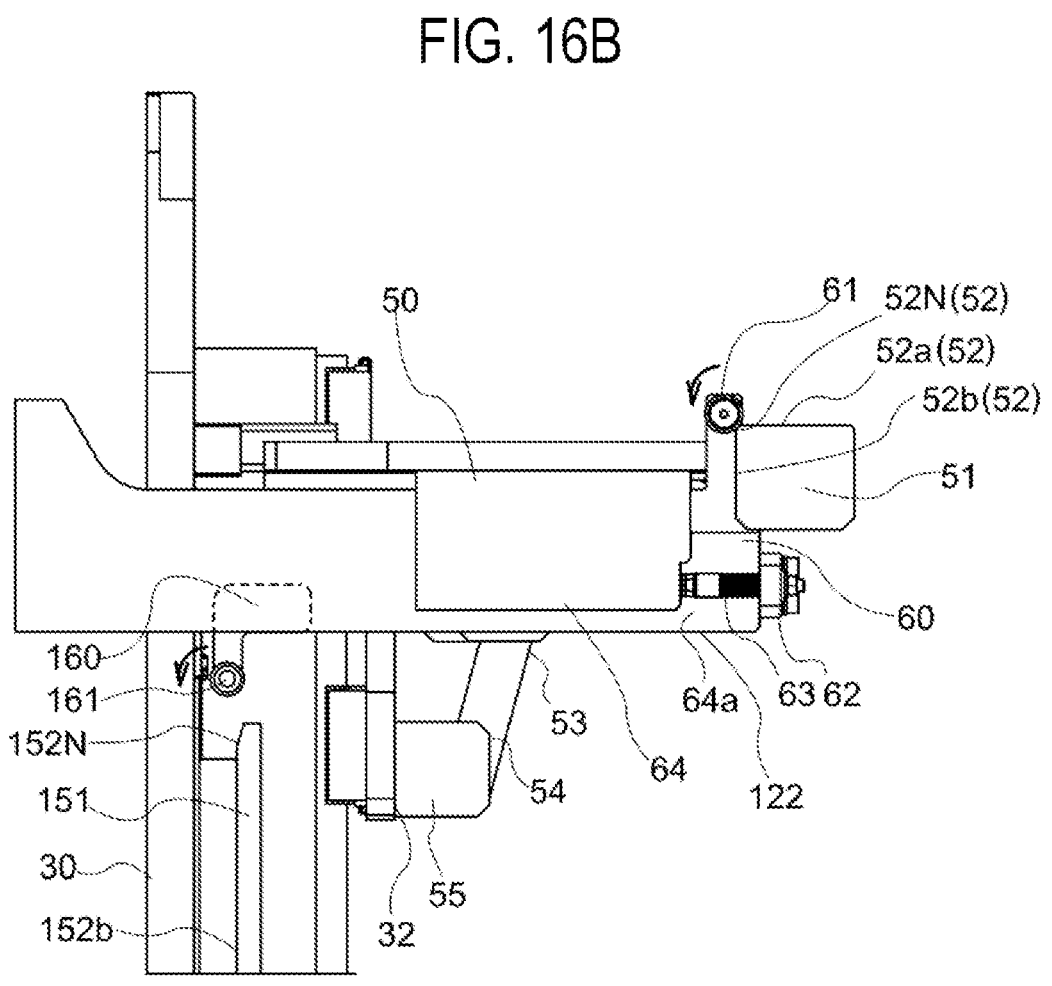

Subsequently, as the drive member 32 moves down along the guide 33, the spring 63 installed at the arm member 122 contracts, and the guide roller 61 moves while contacting the guide connection portion 52N as shown in FIG. 16A. A portion of the lower end of the guide roller 61 is disposed below the guide surface 52*a* extending along the Y direction. At that time, the spring 63 installed at the arm member 122 is contracted by coming into contact with the spring bearing portion 64*a*, such that the pressing force of the spring 63 acts on the guide roller 61 along the Y direction. Since the guide roller 61 moves while being pressed toward the guide connection portion 52N, a portion of the lower end of the guide roller 61 moves while being in contact with the guide connection portion 52N. Therefore, even in a case where there is an appropriate clearance in the link mechanism N, a gap is not formed between the guide roller 61 and the guide connection portion 52N. At this time, the guide roller 161 installed at the arm member 122 is disposed above the guide member 151 extending along the Z direction, but is spaced apart from the guide member 151.

Figure 17A:
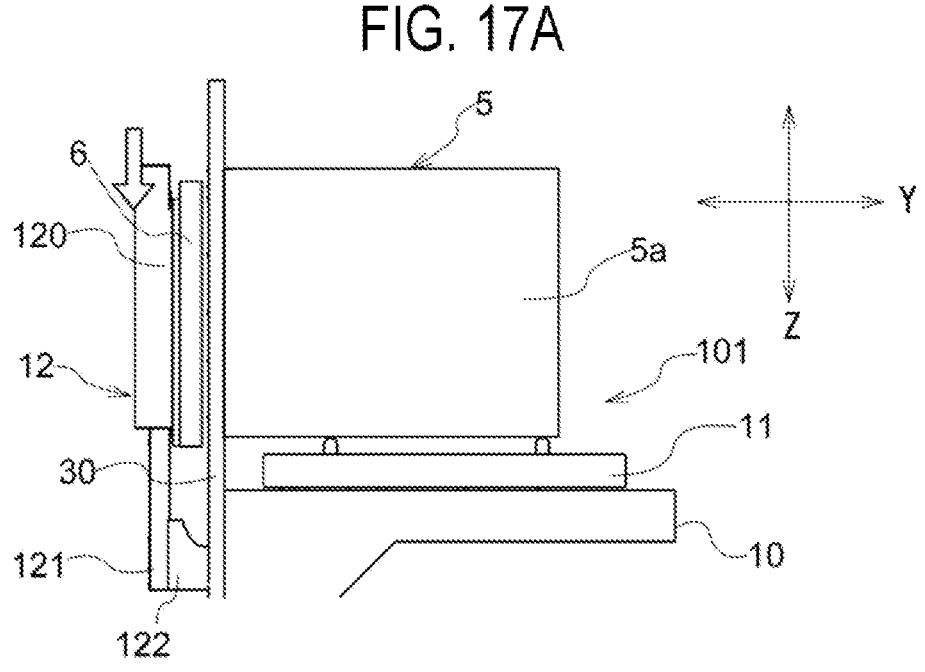
FIGS. 17A and 17B are side views showing the load port door moved in the Z direction.
Figure 17B:
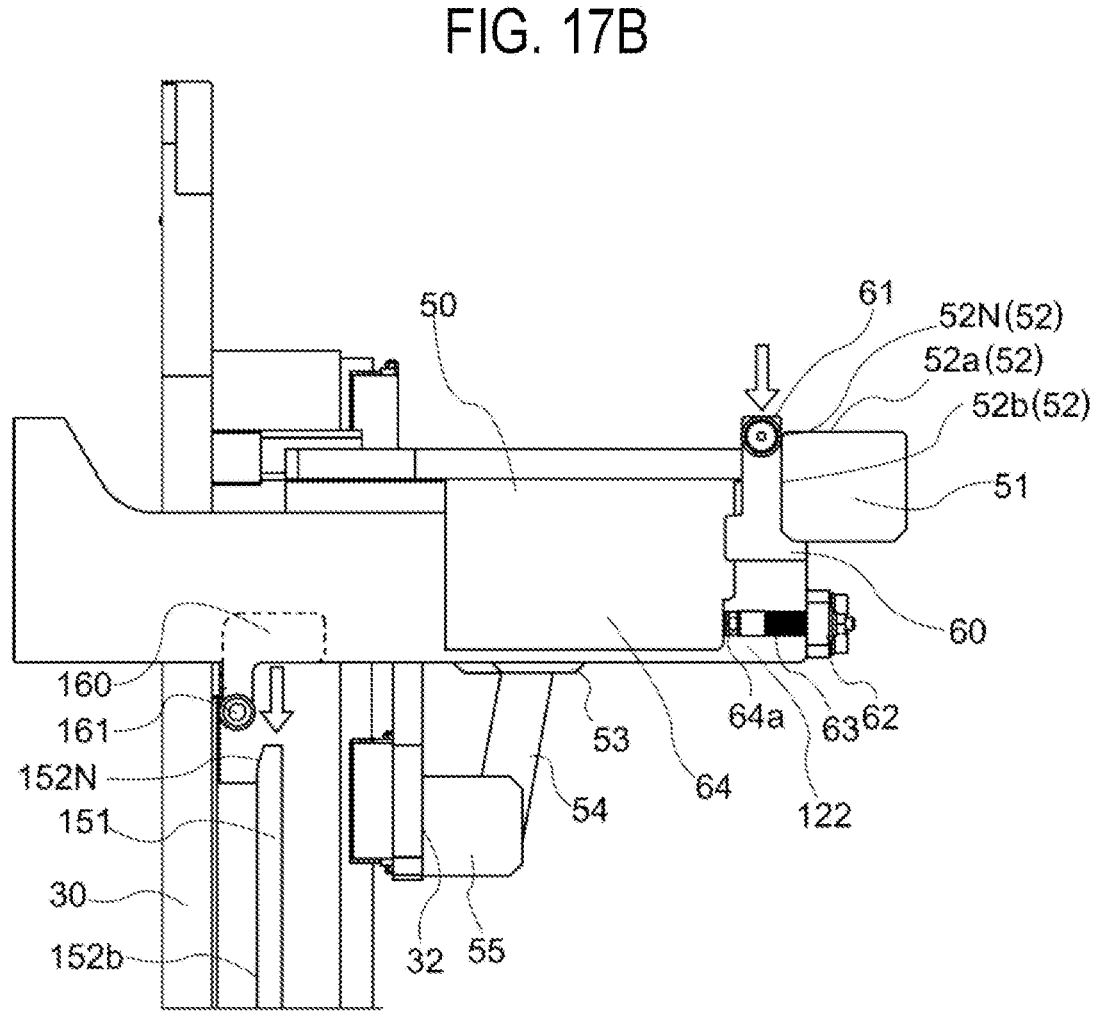

Subsequently, as the drive member 32 moves down along the guide 33, the spring 63 installed at the arm member 122 contracts further, and the guide roller 61 moves over the guide connection portion 52N from the guide surface 52*a* extending along the Y direction to the guide surface 52*b* extending along the Z direction as shown in FIG. 17B. At that time, as the guide roller 61 moves, the link member 54 reduces the inclination with respect to the vertical direction, and the FOUP door 6 moves in the Z direction as shown in FIG. 17A.

Figure 18A:
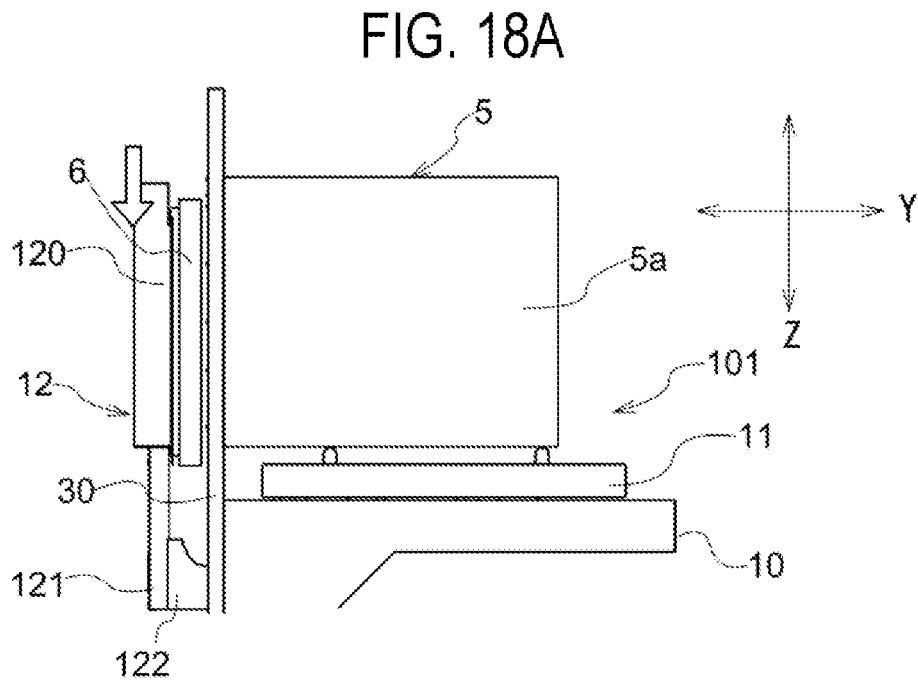
FIGS. 18A and 18B are side views showing the load port door lowered in the Z direction.
Figure 18B:
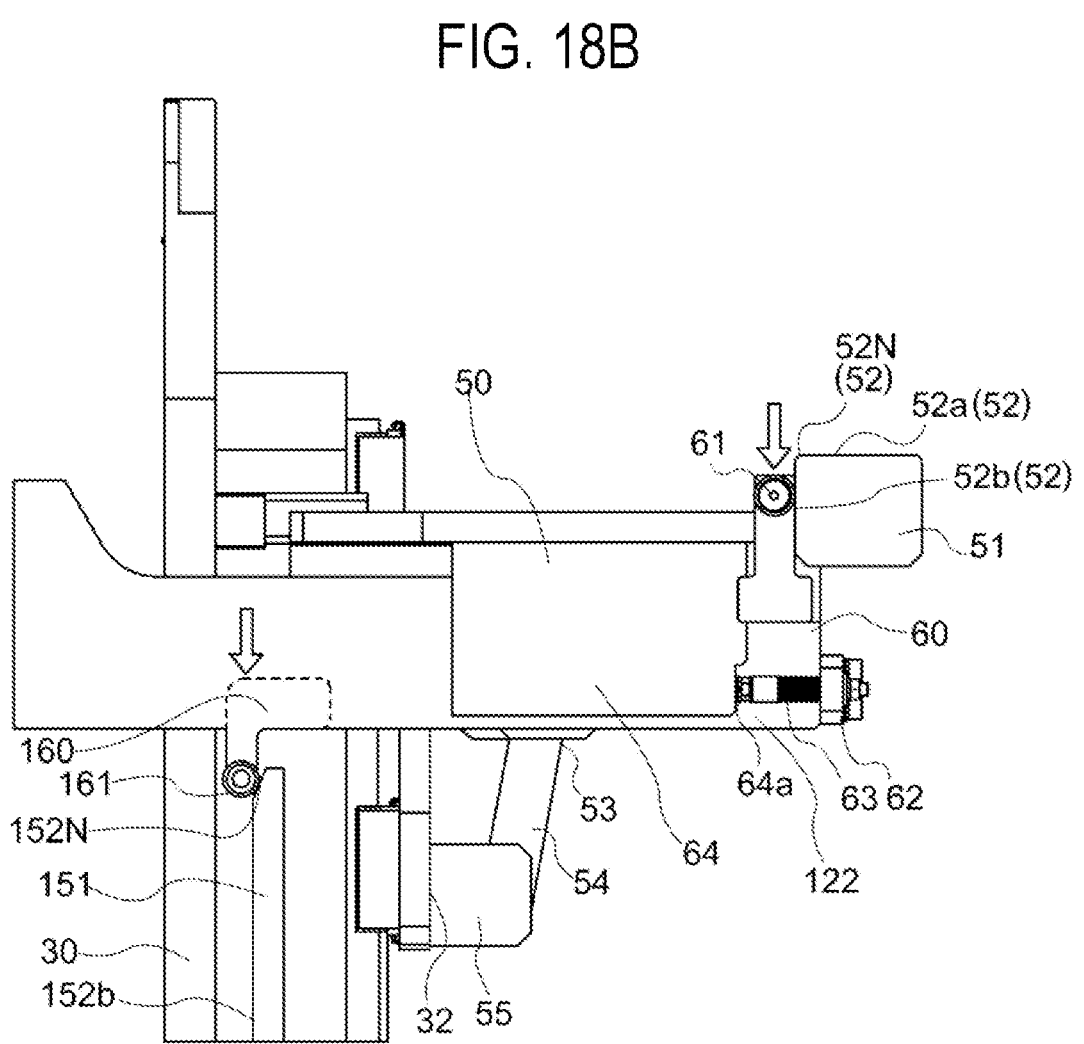

Thereafter, when the drive member 32 moves down along the guide 33, the guide roller 61 is guided by the guide surface 52*b* extending along the Z direction to move down in the Z direction as shown in FIG. 18B. At that time, the link member 54 does not change its inclination with respect to the vertical direction as the guide roller 61 moves. The contracted length of the spring 63 installed at the arm member 122 also does not change. The FOUP door 6 moves in the Z direction as shown in FIG. 18A.

When the guide roller 61 is guided by the guide surface 52*b* and moved down in the Z direction as described above, the guide roller 161 comes into contact with the inclined surface portion 152N of the guide member 151 extending along the Z direction as shown in FIG. 18B. When the guide roller 161 comes into contact with the inclined surface portion 152N, the guide roller 61 is in contact with the guide surface 52*b* extending along the Z direction. Therefore, the guide roller 61 moves by being guided by the guide surface 52*b*, and the guide roller 161 moves down by being guided by the inclined surface portion 152N.

Figure 19A:
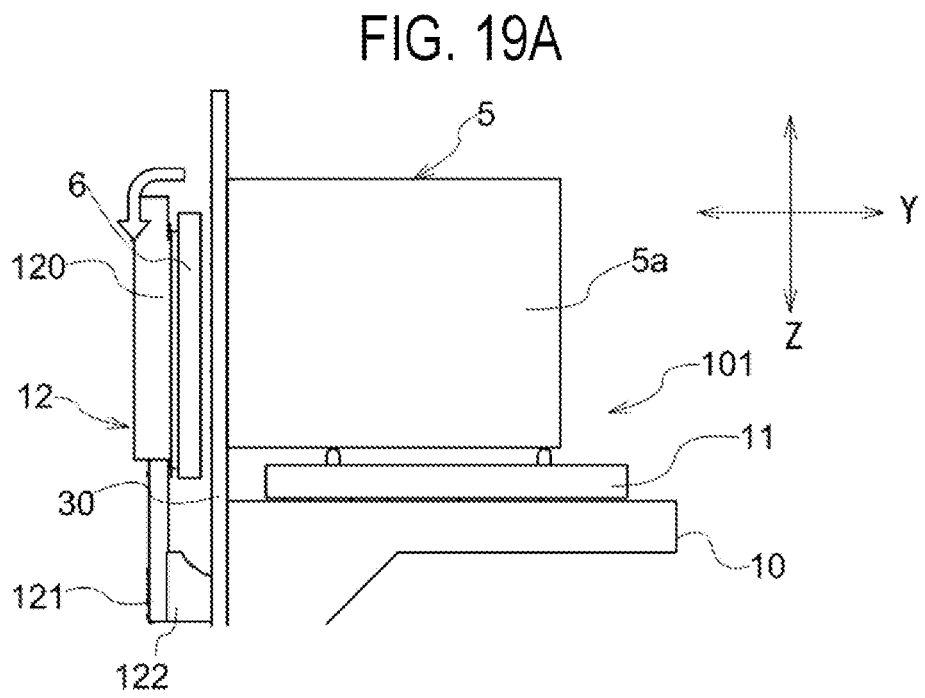
FIGS. 19A and 19B are side views showing the load port door lowered in the Z direction.
Figure 19B:
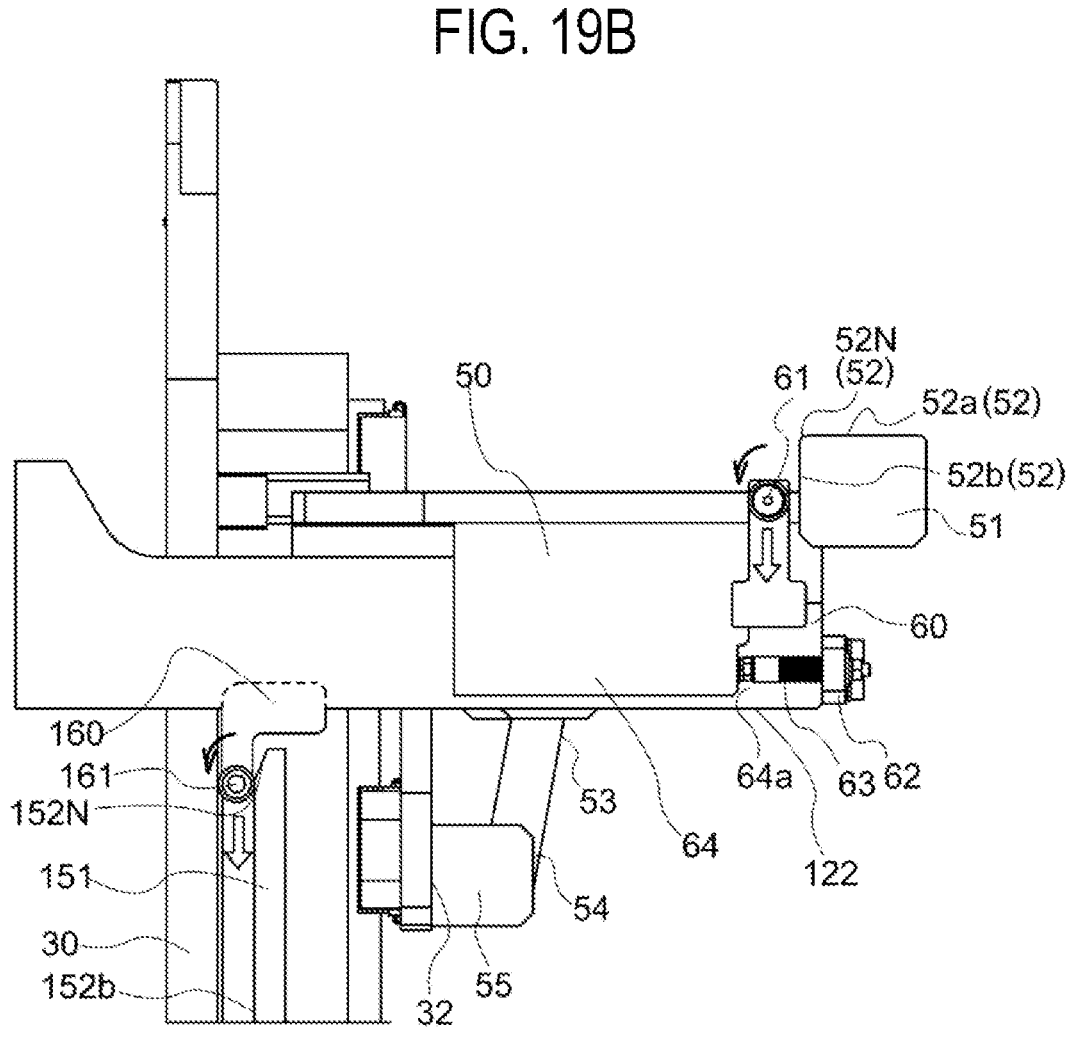

Thereafter, when the drive member 32 moves down along the guide 33, the spring 63 installed at the arm member 122 comes into the most contracted state, and the guide roller 161 moves over the inclined surface portion 152N from the inclined surface portion 152N to the guide surface 152b of the guide member 151 extending along the Z direction as shown in FIG. 19B. At that time, as the guide roller 161 moves, the link member 54 further reduces the inclination with respect to the vertical direction, and the FOUP door 6 moves in the Z direction as shown in FIG. 19A.

When the guide roller 161 moves over the inclined surface portion 152N to the guide surface 152b in this way, the guide roller 161 is located at a position closer to the base member 30 than when the guide roller 161 is in contact with the inclined surface portion 152N. Therefore, the guide roller 61 guided by the guide surface 52b of the guide member 51 moves to a position spaced apart from the guide surface 52b as shown in FIG. 19B.

Thereafter, in the arm member 122, the guide roller 161 moves down by being guided by the guide surface 152b in a state in which the guide roller 61 is spaced apart from the guide surface 52b. At that time, the FOUP door 6 moves in the Z direction as in the load port 1 shown in FIG. 11.

In addition, the operation when the guide roller 61 moves over the guide connection portion 52N during the door opening operation, and the door closing operation are the same as those in the first embodiment.

The load port 101 according to the present embodiment described above obtains the same effects as those of the load port 1 according to the first embodiment.

In addition, when the arm member 122 is moved down by opening the FOUP door 6 of the FOUP 5, the guide roller 61 moved down while being guided by the guide surface 52b, and then the guide roller 161 moves down while being guided by the guide surface 152b. That is, the guide portion when the arm member 122 moves down is switched from the guide surface 52b to the guide surface 152b.

For example, it is assumed that the guide surface 52b extends downward, and the guide roller 61 installed at the distal end of the arm member 122 is always guided by the guide surface 52b while the door opening operation of opening the FOUP door 6 of the FOUP 5 is performed.

In such a case, since the guide surface 52b is disposed at a position relatively distant from the guide 33 of the drive member 32, a large moment is always applied to the arm member 122 while the arm member 122 moved down. Therefore, it is necessary to increase a strength of the arm member 122 so that the arm member 122 is not damaged by the large moment. As a result, the arm member 122 may become large.

In contrast, in the present embodiment, while the door opening operation of opening the FOUP door 6 of the FOUP 5 is being performed, first, the guide roller 61 installed at the distal end of the arm member 122 is guided by the guide surface 52b. Thereafter, the guide roller 161 installed at the proximal end of the arm member 122 is guided by the guide surface 152b. Since the guide surface 152b is disposed at a position relatively close to the guide 33 of the drive member 32, when the guide roller 161 is guided by the guide surface 152b, the arm member 122 is applied with a smaller moment than when the guide roller 61 is guided by the guide surface 52b. Therefore, there is no need to increase the strength of the arm member 122 very much. As a result, it is possible to reduce a size of the arm member 122.

Figure 20:
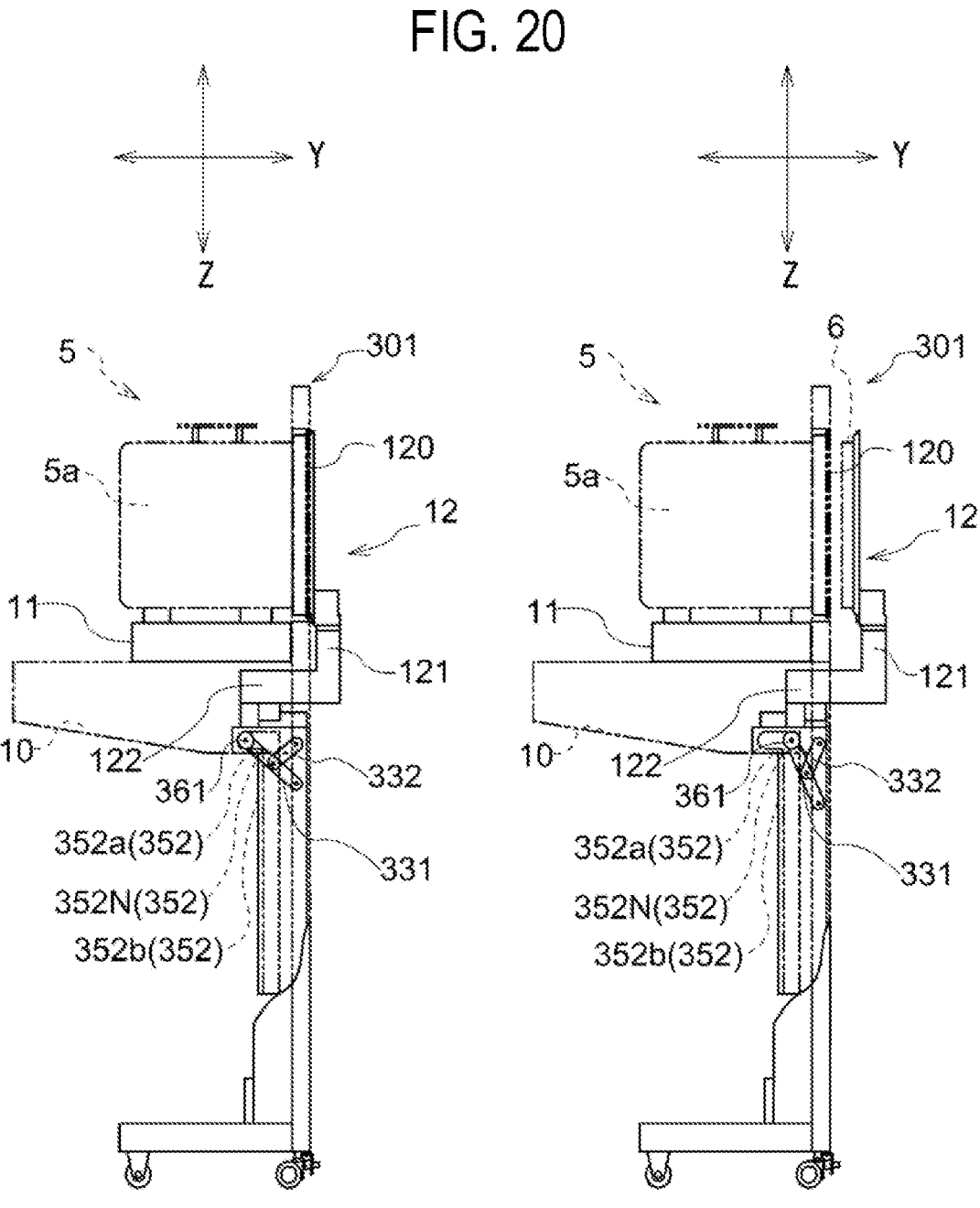
FIG. 20 is a diagram illustrating a modification according to the present disclosure.

As described above, when the door opening operation of opening the FOUP door 6 of the FOUP 5 is performed, a point where the arm member 122 is guided in the Z direction is switched from the guide surface 52b arranged at a position relatively distant from the guide 33 of the drive member 32 to the guide surface 152b arranged at a position relatively close to the guide 33 of the drive member 32, which makes it possible to reduce the size of the arm member 122. Therefore, a degree of freedom in arranging the guide member 151 in a space below the mounting table 10 of the load port 101 increases. Further, in the present embodiment, as compared with the structure in the related art as shown in FIG. 20, the guide member configured to guide the arm member 122 is separated into the guide member 51 and the guide member 151 which may be disposed at respective locations. Accordingly, the degree of freedom in arranging the guide members can be increased while reducing the size of the link mechanism.

In addition, the specific configuration of each part is not limited to the above-described embodiments.

In the first and second embodiments, the spring 63 is used as the presser configured to press the guide roller 61 toward the guide connecting portion 52N. However, the present disclosure is not limited thereto. An arbitrary presser may be used as long as it can press the guide roller 61 toward the guide connection portion 52N. As the presser, for example, a pneumatic device such as an air cylinder or the like, or a shock absorbing device such as a shock absorber or the like may be used.

In the first and second embodiments, the pressing force of the spring 63 acts along the Y direction. However, the present disclosure is not limited thereto. The direction of the pressing force of the spring 63 is arbitrary as long as the spring 63 can press the guide roller 61 toward the guide connection portion 52N.

In the first and second embodiments, the guide surfaces 52 (the guide surface 52a extending along the Y direction and the guide surface 52b extending along the Z direction) are formed by the upper surface and the end surface of the guide member 51. However, the present disclosure is not limited thereto. The guide surfaces 52 may be, for example, guide grooves formed to enable the guide roller 61 to move, as long as they can guide the guide roller 61.

In the first and second embodiments, the spring 63 is installed at the movable door member 12, and the spring 63 comes into contact with a non-moving member (spring bearing plate 64). However, the present disclosure is not limited thereto. For example, the spring 63 may be installed at a non-moving member (spring bearing plate 64), and the member installed at the movable door member 12 may come into contact with the spring 63.

In the first and second embodiments, the guide connection portion 52N that connects the guide surface 52a and the guide surface 52b is formed in an R shape (curved surface shape such that the guide roller 61 may smoothly move from the guide surface 52a to the guide surface 52b. However, the present disclosure is not limited thereto. The guide connection portion 52N that connects the guide surface 52a and the guide surface 52b may be connected without passing through an R shape (curved surface shape). For example, in a case where the guide surface 52a extending along the Y direction is a plane extending in the horizontal direction and the guide surface 52b extending along the Z direction is a plane extending in the vertical direction, the guide surface 52a and the guide surface 52b may be connected vertically. In such a case, the guide connection portion 52N that connects the guide surface 52a and the guide surface 52b is a portion where the guide surfaces 52a and 52b are connected in a straight line. In that case as well, the effects of the present disclosure are obtained by providing a presser that presses one end of the link member toward the guide connection portion 52N when the one end of the link member passes through the guide connection portion 52N.

In the first and second embodiments, the first direction is set to the horizontal direction and the second direction is set to the vertical direction. However, the first direction and the second direction may be set to directions different from the horizontal direction and the vertical direction.

In the first and second embodiments, the driver T configured to drive the drive member 32 along the Z direction includes the ball screw. However, the present disclosure is not limited thereto. The driver T may be a device configured to move the drive member 32 as a toothed belt rotates, or may be a lifting device configured to reciprocate in the vertical direction.

In the first embodiment, two guide surfaces 52 are provided, and the spring 63 is disposed on each of the guide surfaces 52. However, the present disclosure is not limited thereto. For example, one spring may be disposed on only one of the two guide surfaces 52. The load port of the present disclosure may have one guide surface 52, and one spring may be disposed on one guide surface 52.

In addition, in the second embodiment, two guide members 51 and two guide members 151 are disposed at positions spaced apart in the width direction of the load port 101. However, the present disclosure is not limited thereto. For example, one guide member 51 and one guide member 151 may be disposed at predetermined positions with respect to the width direction of the load port 101.

In the first and second embodiments, the link mechanism N is formed by one link member 54. However, the link mechanism N is not limited thereto. The link mechanism N of the present disclosure may be configured to allow the guide roller to move from the Y direction to the Z direction or from the Z direction to the Y direction along the guide surface while the other end of the link member is moving in the Z direction.

For example, as shown in FIG. 20, the present disclosure may also be applied to a load port 301 provided with a link mechanism N including a main-operation link 331 and a sub-operation link 332 (the load port disclosed in Japanese Patent Application Publication No. 2014-225547). The load port 301 may be configured to allow the guide roller 361 moving together with the door member 12 to move along the guide surface 352 from the Y direction to the Z direction or from the Z direction to the Y direction while the other end of the main-operation link 331 is moving in the Z direction, and may include a presser configured to press the guide roller 361 toward the guide connection portion 352N when the guide roller 361 passes through the guide connection portion 352N that connects the guide surface 352a extending along the Y direction and the guide surface 352b extending along the Z direction.

In the first and second embodiments, material of the substrate as a transfer target object is arbitrary. For example, the substrate as a transfer target object may be a circular substrate such as a wafer or a ring frame, a glass substrate, a resin substrate, or other square substrates.

In the first and second embodiments, the FOUP 5 is used as a storage container configured to store the substrate. Even when a storage container with a door of another type may be configured in the same manner to obtain the effects similar to the above-described effects. As the storage container, for example, a FOSB (Front Opening Shipping Box), an open cassette, and the like may be used in addition to the FOUP. Additionally, the storage container may not have the FOUP door.

According to the present disclosure described above, it is possible to suppress vibration of a door when opening and closing the door.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A load port comprising:
a plate-shaped base member having an opening via which a transfer target object is loaded and unloaded;
a door member capable of opening and closing the opening;
a link mechanism including a link member having one end rotatably connected to the door member;
a guide roller configured to move together with the door member;
a guide surface bent to extend from a first direction to a second direction and configured to guide the guide roller;
a drive member to which the other end of the link member is rotatably connected; and
a driver configured to move the drive member in the second direction,
wherein the link mechanism is configured to allow the guide roller to move along the guide surface from the first direction to the second direction or from the second direction to the first direction while the other end of the link member is moving in the second direction, and
wherein a presser is provided to press the guide roller toward a guide connection portion when the guide roller passes through the guide connection portion that connects a first guide surface extending along the first direction and a second guide surface extending along the second direction.

2. The load port of claim 1, wherein the presser includes an elastic member disposed along the first direction.

3. The load port of claim 2, wherein the elastic member is movable together with the door member, and
wherein an elastic member bearing member is disposed at a position where the elastic member bearing member comes into contact with the elastic member when the guide roller moves so as to be closer to the guide connection portion and a distance between the guide roller and the guide connection portion becomes a predetermined distance.

4. The load port of claim 1, wherein a pressing force of the presser is smaller than a driving force that moves the door member in the first direction when the drive member moves in the second direction.

5. The load port of claim 2, wherein a pressing force of the presser is smaller than a driving force that moves the door member in the first direction when the drive member moves in the second direction.

6. The load port of claim 3, wherein a pressing force of the presser is smaller than a driving force that moves the door member in the first direction when the drive member moves in the second direction.

7. The load port of claim 1, wherein two guide surfaces are arranged on both sides of the drive member, and
wherein the presser is arranged on each of the two guide surfaces.

8. The load port of claim 2, wherein two guide surfaces are arranged on both sides of the drive member, and
 wherein the presser is arranged on each of the two guide surfaces.

9. The load port of claim 3, wherein two guide surfaces are arranged on both sides of the drive member, and
 wherein the presser is arranged on each of the two guide surfaces.

\* \* \* \* \*